United States Patent [19]
Tanaka et al.

[11] Patent Number: 5,912,869
[45] Date of Patent: Jun. 15, 1999

[54] RECORDING MEDIUM DATA TRANSMISSION METHOD AND APPARATUS AND DATA REPRODUCTION METHOD AND APPARATUS

[75] Inventors: Shin-ichi Tanaka, Kyoto; Toshiyuki Shimada, Kobe; Tadashi Kojima; Koichi Hirayama, both of Yokohama, all of Japan

[73] Assignees: Matsushita Electric Industrial Co., Ltd., Osaka; Kabushiki Kaisha Toshiba, Kanagawa, both of Japan

[21] Appl. No.: 08/626,551

[22] Filed: Apr. 2, 1996

[30] Foreign Application Priority Data

Apr. 3, 1995 [JP] Japan .................................. 7-077974
Oct. 16, 1995 [JP] Japan .................................. 7-267485

[51] Int. Cl.⁶ .............................. G11B 5/76; G11B 5/09
[52] U.S. Cl. .............................................. 369/59; 360/41
[58] Field of Search ................................ 369/13, 54, 58, 369/32, 59, 124, 47, 48; 360/41, 27, 28, 48, 51

[56] References Cited

U.S. PATENT DOCUMENTS

| | | |
|---|---|---|
| 4,323,931 | 4/1982 | Jacoby . |
| 4,501,000 | 2/1985 | Immink et al. . |
| 4,539,666 | 9/1985 | Wachi .................................. 369/59 X |
| 4,685,098 | 8/1987 | Yoshida ...................................... 369/59 |
| 4,703,494 | 10/1987 | Ozaki et al. . |
| 4,728,929 | 3/1988 | Tanaka . |
| 5,151,699 | 9/1992 | Moriyama . |
| 5,276,674 | 1/1994 | Tanaka . |
| 5,333,126 | 7/1994 | Fukuda et al. . |
| 5,629,924 | 5/1997 | Yokogawa et al. .................... 369/13 X |
| 5,666,338 | 9/1997 | Ishizawa et al. ....................... 369/59 X |

FOREIGN PATENT DOCUMENTS

| | | |
|---|---|---|
| 0178813 | 4/1978 | European Pat. Off. . |
| 0193153 | 9/1986 | European Pat. Off. . |
| 0415853 | 3/1991 | European Pat. Off. . |
| 0511498 | 11/1992 | European Pat. Off. . |
| 0545516 | 6/1993 | European Pat. Off. . |
| 0577402 | 1/1994 | European Pat. Off. . |
| 0597443 | 5/1994 | European Pat. Off. . |
| 0625828 | 11/1994 | European Pat. Off. . |
| 0673029 | 9/1995 | European Pat. Off. . |
| 4304267 | 8/1993 | Germany . |

(List continued on next page.)

OTHER PUBLICATIONS

English Language Abstract of SHO 63–56610.
"Sequence–state Methods for Run–Length–Limited Coding", by P.A. Franaszek, was published on pp. 376–383 of IBM J. Res. Develop. in Jul. 1970.
Pp. 41,42, and 54 of *American National Standard For Information Systems,* entitled "90 mm (3.54 in) Optical disk Cartiridge Rewritable And Read Only Using Discrete Block Format (DBF) Method–For–Digital Information Interchange", (ANSI X3.213–199X).

(List continued on next page.)

*Primary Examiner*—Paul W. Huber
*Attorney, Agent, or Firm*—Greenblum & Bernstein P.L.C.

[57] ABSTRACT

A data transmission apparatus for transmitting an original data has a converter for converting the original data to sequential data codes. The data code is formed by a combination of HIGH level binary codes and LOW level binary codes. The maximum length of a continuous binary codes of one level, such as HIGH level, in the data codes is limited to $T_{max}$, e.g., to 14T, in which T is a unit length representing one binary code, and the minimum length of a continuous binary codes of one level, such as HIGH level, in the data codes is limited to $T_{min}$, e.g., 3T. A generator generates a synchronization code. The synchronization code is formed by a combination of HIGH and LOW level binary codes. The synchronization code comprises an identifier having a continuous binary codes of one level, such as HIGH level, with a predetermined length 16T which is 2T greater than $T_{max}$. An inserter inserts the synchronization code intermittently in the sequential data codes.

50 Claims, 20 Drawing Sheets

FOREIGN PATENT DOCUMENTS

| | | |
|---|---|---|
| 63-56610 | 5/1983 | Japan . |
| 0347934 | 6/1985 | Japan . |
| 60-106254 | 6/1985 | Japan . |
| 60-114053 | 6/1985 | Japan . |
| 62-281523 | 12/1987 | Japan . |
| 2061575 | 5/1981 | United Kingdom . |

OTHER PUBLICATIONS

Fig. 4.9. Sections 4.3.3.4 and 4.3.3.5 and Tables 4.4.1 and 4.4.2 of *Proposed American National Standard For Digital Information Interchange,* entitled "86 mm (90 mm Case, 86mm Disk) Rewritable Optical Disk Cartridge Using Discrete Block Format (DBF) Method", dated Jan. 3, 1990.

A Copy of an International Search Report issued in counterpart PCT applicaiton PCT/JP96/00879.

Patent Abstracts of Japan, vol. 12, No. 174 (P–612), May 24, 1988.

Patent Abstracts of Japan, vol. 9, No. 270 (E–353), Oct. 26, 1985.

Patent Abstracts of Japan, vol. 9, No. 258 (E–350), Oct. 16, 1985.

A Copy of an International Search Report issued in counterpart PCT application PCT/JP96/00878.

A Copy of an International Search Report issued in counterpart PCT application PCT/JP96/00880.

Fig.2

8/15 CONVERSION TABLE

| DATA WORD | CODE WORD | DATA WORD | CODE WORD | DATA WORD | CODE WORD |
|---|---|---|---|---|---|
| 0 | 000000000100001 | 50 | 000010000000010 | 100 | 000100010010000 |
| 1 | 000000000100010 | 51 | 000010000000100 | 101 | 000100010010001 |
| 2 | 000000000100100 | 52 | 000010000001000 | 102 | 000100010010010 |
| 3 | 000000001000000 | 53 | 000010000001001 | 103 | 000100100000000 |
| 4 | 000000001000001 | 54 | 000010000010000 | 104 | 000100100000001 |
| 5 | 000000001000010 | 55 | 000010000010001 | 105 | 000100100000010 |
| 6 | 000000001000100 | 56 | 000010000010010 | 106 | 000100100000100 |
| 7 | 000000001001000 | 57 | 000010000100000 | 107 | 000100100001000 |
| 8 | 000000001001001 | 58 | 000010000100001 | 108 | 000100100001001 |
| 9 | 000000010000000 | 59 | 000010000100010 | 109 | 000100100010000 |
| 10 | 000000010000001 | 60 | 000010000100100 | 110 | 000100100010001 |
| 11 | 000000010000010 | 61 | 000010001000000 | 111 | 000100100010010 |
| 12 | 000000010000100 | 62 | 000010001000001 | 112 | 000100100100000 |
| 13 | 000000010001000 | 63 | 000010001000010 | 113 | 000100100100001 |
| 14 | 000000010001001 | 64 | 000010001000100 | 114 | 000100100100010 |
| 15 | 000000010010000 | 65 | 000010001001000 | 115 | 000100100100100 |
| 16 | 000000010010001 | 66 | 000010001001001 | 116 | 001000000000010 |
| 17 | 000000010010010 | 67 | 000010010000000 | 117 | 001000000000100 |
| 18 | 000000100000000 | 68 | 000010010000001 | 118 | 001000000001000 |
| 19 | 000000100000001 | 69 | 000010010000010 | 119 | 001000000001001 |
| 20 | 000000100000010 | 70 | 000010010000100 | 120 | 001000000010000 |
| 21 | 000000100000100 | 71 | 000010010001000 | 121 | 001000000010001 |
| 22 | 000000100001000 | 72 | 000010010001001 | 122 | 001000000010010 |
| 23 | 000000100001001 | 73 | 000010010010000 | 123 | 001000000100000 |
| 24 | 000000100010000 | 74 | 000010010010001 | 124 | 001000000100001 |
| 25 | 000000100010001 | 75 | 000010010010010 | 125 | 001000000100010 |
| 26 | 000000100010010 | 76 | 000100000000001 | 126 | 001000000100100 |
| 27 | 000000100100000 | 77 | 000100000000010 | 127 | 001000001000000 |
| 28 | 000000100100001 | 78 | 000100000000100 | 128 | 001000001000001 |
| 29 | 000000100100010 | 79 | 000100000001000 | 129 | 001000001000010 |
| 30 | 000000100100100 | 80 | 000100000001001 | 130 | 001000001000100 |
| 31 | 000001000000001 | 81 | 000100000010000 | 131 | 001000001001000 |
| 32 | 000001000000010 | 82 | 000100000010001 | 132 | 001000001001001 |
| 33 | 000001000000100 | 83 | 000100000010010 | 133 | 001000010000000 |
| 34 | 000001000001000 | 84 | 000100000100000 | 134 | 001000010000001 |
| 35 | 000001000001001 | 85 | 000100000100001 | 135 | 001000010000010 |
| 36 | 000001000010000 | 86 | 000100000100010 | 136 | 001000010000100 |
| 37 | 000001000010001 | 87 | 000100000100100 | 137 | 001000010001000 |
| 38 | 000001000010010 | 88 | 000100001000000 | 138 | 001000010001001 |
| 39 | 000001000100000 | 89 | 000100001000001 | 139 | 001000010010000 |
| 40 | 000001000100001 | 90 | 000100001000010 | 140 | 001000010010001 |
| 41 | 000001000100010 | 91 | 000100001000100 | 141 | 001000010010010 |
| 42 | 000001000100100 | 92 | 000100001001000 | 142 | 001000100000000 |
| 43 | 000001001000000 | 93 | 000100001001001 | 143 | 001000100000001 |
| 44 | 000001001000001 | 94 | 000100010000000 | 144 | 001000100000010 |
| 45 | 000001001000010 | 95 | 000100010000001 | 145 | 001000100000100 |
| 46 | 000001001000100 | 96 | 000100010000010 | 146 | 001000100001000 |
| 47 | 000001001001000 | 97 | 000100010000100 | 147 | 001000100001001 |
| 48 | 000001001001001 | 98 | 000100010001000 | 148 | 001000100010000 |
| 49 | 000010000000001 | 99 | 000100010001001 | 149 | 001000100010001 |

Fig.3

8 / 15 CONVERSION TABLE

| DATA WORD | CODE WORD | DATA WORD | CODE WORD | DATA WORD | CODE WORD |
|---|---|---|---|---|---|
| 150 | 001000100010010 | 100 | 010000100000010 | 250 | 010010010000100 |
| 151 | 001000100100000 | 201 | 010000100000100 | 251 | 010010010001000 |
| 152 | 001000100100001 | 202 | 010000100001000 | 252 | 010010010001011 |
| 153 | 001000100100010 | 203 | 010000100001001 | 253 | 010010010010000 |
| 154 | 001000100100100 | 204 | 010000100010000 | 254 | 010010010010001 |
| 155 | 001001000000001 | 205 | 010000100010001 | 255 | 010010010010010 |
| 156 | 001001000000010 | 206 | 010000100010010 | | |
| 157 | 001001000000100 | 207 | 010000100100000 | | |
| 158 | 001001000001000 | 208 | 010000100100001 | | |
| 159 | 001001000001001 | 209 | 010000100100010 | | |
| 160 | 001001000010000 | 210 | 010000100100100 | | |
| 161 | 001001000010001 | 211 | 010001000000001 | | |
| 162 | 001001000010010 | 212 | 010001000000010 | | |
| 163 | 001001000100000 | 213 | 010001000000100 | | |
| 164 | 001001000100001 | 214 | 010001000001000 | | |
| 165 | 001001000100010 | 215 | 010001000001001 | | |
| 166 | 001001000100100 | 216 | 010001000010000 | | |
| 167 | 001001001000000 | 217 | 010001000010001 | | |
| 168 | 001001001000001 | 218 | 010001000010010 | | |
| 169 | 001001001000010 | 219 | 010001000100000 | | |
| 170 | 001001001000100 | 220 | 010001000100001 | | |
| 171 | 001001001001000 | 221 | 010001000100010 | | |
| 172 | 001001001001001 | 222 | 010001000100100 | | |
| 173 | 010000000000100 | 223 | 010001001000000 | | |
| 174 | 010000000001000 | 224 | 010001001000001 | | |
| 175 | 010000000001001 | 225 | 010001001000010 | | |
| 176 | 010000000010000 | 226 | 010001001000100 | | |
| 177 | 010000000010001 | 227 | 010001001001000 | | |
| 178 | 010000000010010 | 228 | 010001001001001 | | |
| 179 | 010000000100000 | 229 | 010010000000001 | | |
| 180 | 010000000100001 | 230 | 010010000000010 | | |
| 181 | 010000000100010 | 231 | 010010000000100 | | |
| 182 | 010000000100100 | 232 | 010010000001000 | | |
| 183 | 010000001000000 | 233 | 010010000001001 | | |
| 184 | 010000001000001 | 234 | 010010000010000 | | |
| 185 | 010000001000010 | 235 | 010010000010001 | | |
| 186 | 010000001000100 | 236 | 010010000010010 | | |
| 187 | 010000001001000 | 237 | 010010000100000 | | |
| 188 | 010000001001001 | 238 | 010010000100001 | | |
| 189 | 010000010000000 | 239 | 010010000100010 | | |
| 190 | 010000010000001 | 240 | 010010000100100 | | |
| 191 | 010000010000010 | 241 | 010010001000000 | | |
| 192 | 010000010000100 | 242 | 010010001000001 | | |
| 193 | 010000010001000 | 243 | 010010001000010 | | |
| 194 | 010000010001001 | 244 | 010010001000100 | | |
| 195 | 010000010010000 | 245 | 010010001001000 | | |
| 196 | 010000010010001 | 246 | 010010001001001 | | |
| 197 | 010000010010010 | 247 | 010010010000000 | | |
| 198 | 010000100000000 | 248 | 010010010000001 | | |
| 199 | 010000100000001 | 249 | 010010010000010 | | |

Fig.6

|  | TYPE INFO 1 | CODE WORD | TYPE INFO 2 | CODE WORD |
|---|---|---|---|---|
| SYNC CODE S1 | 10010 | 114 | 00010 | 86 |
| SYNC CODE S2 | 01001 | 102 | 01000 | 96 |
| SYNC CODE S3 | 10001 | 111 | 10000 | 105 |
| SYNC CODE S4 | 00000 | 77 | 00001 | 83 |

RECORDING MEDIUM DATA TRANSMISSION METHOD AND APPARATUS AND DATA REPRODUCTION METHOD AND APPARATUS

TECHNICAL FIELD

The present invention relates to a recording medium to which information in which a synchronization code has been inserted is recorded, to a data transmission method and apparatus for transmitting the information to which said synchronization code has been inserted, and to a data reproducing method and apparatus for reproducing the transmitted information.

BACKGROUND ART

Data recorded to a magnetic disk, optical disk, or other such recording medium is conventionally modulated to code words based on a coding method having specific coding rules to enable accurate reading during reproduction. One of these coding rules is to insert a synchronization code at the beginning of each frame, which is a data unit containing a known constant amount of data. The coded data containing the inserted synchronization code is then converted to a modulated signal, e.g., an NRZI (non-return to zero inverse) signal, which is recorded to the recording medium. The reproduction apparatus digital/analog converts the analog reproduction signal to obtain the NRZI signal, and then converts the NRZI signal to parallel data to obtain the code sequence from which the code words are extracted synchronized to the word clock. This word clock identifies the divisions between code words in the code sequence; the word clock phase is controlled based on the synchronization code. The extracted code words are then decoded and error correction processing is applied to obtain the processable data.

The synchronization code is also written as a code pattern that will not appear in the coded data recorded to the recording medium, and can therefore be discriminated from the other (non-synchronization code) data. More specifically, the coding rules normally define the maximum and minimum numbers of consecutive zeroes (0) bracketed by ones (1) that can appear in any one code word. The rules may further prohibit the maximum number of consecutive zeroes that can be in series separated by 1 at the conjunction of two or more words. As a result, the NRZI signal expressing the data code (non-synchronization code) part of the entire code according to said rules is a signal comprising maximum inversion interval $T_{max}$ and minimum inversion interval $T_{min}$.

An example of this coding method is the EFM (eight-to-fourteen modulation) modulation method used with optical disks. In EFM-coded signals, code segments inverting at the maximum inversion interval $T_{max}$ will not appear consecutively in the NRZI signal expressing the non-synchronization code data. With EFM coding, the synchronization code therefore includes NRZI signals in which the maximum inversion interval $T_{max}$ occurs twice in succession.

FIG. 20 shows the pits and signal wave recorded to a conventional optical disk for data containing a synchronization code according to the prior art. As shown in FIG. 20, a synchronization code of signal length $TS=2T_{max}$ containing two consecutive maximum inversion intervals $T_{max}$ of the NRZI signal is added to the beginning of each frame of data other than the converted synchronization code. The data to which the synchronization code was added is converted to an NRZI signal, and the NRZI-modulated data is recorded to the optical disk track by forming a pit of a length determined by the HIGH level period of the NRZI signal, followed by a land (space) of a length determined by the LOW level period of the NRZI signal.

FIG. 21 is a timing chart showing the relationship between the reproduction signal for the data containing a synchronization code and reproduced from the recorded content of the optical disk, and the NRZI signal read from the reproduction signal. FIG. 21(a) shows the reproduction signal reproduced from the recorded content of the optical disk. FIG. 21(b) shows the read clock generated at pit interval T. FIG. 21(c) shows the NRZI signal digitized at a threshold value (or a threshold level) V0 according to the read clock. FIG. 21(d) shows the NRZI signal digitized at a variable threshold value (V0+ΔV).

The reproduction signal reproduced from the recorded content of the optical disk is an analog signal as shown in FIG. 21(a). As shown in FIG. 21(b), this reproduction signal is then converted to a digital signal wherein values greater than or equal to the threshold value V0 are HIGH, and values below the threshold value V0 are LOW, based on the read clock of bit interval T. This threshold value may fluctuate, however, according to the low frequency component of the recorded content of the optical disk.

For example, when the signal level is ΔV greater than the threshold value V0 as shown in FIG. 21(a), the HIGH level interval of the NRZI signal obtained from D/A conversion is shortened (=$T_{max}$−2T), and the LOW level interval is lengthened (=$T_{max}$+2T), as shown in FIG. 21(d). Though not shown in the figure, when the signal level is conversely ΔV lower than the threshold value V0, the HIGH level interval of the NRZI signal obtained from D/A conversion is lengthened, and the LOW level interval is shortened. However, even when error occurs in the inversion interval of the NRZI signal obtained by D/A conversion as a result of threshold value fluctuations, the signal length TS of the synchronization code is still TS=$2T_{max}$, and the other data can therefore be accurately discriminated.

There are cases, however, in which the maximum inversion interval $T_{max}$ of the NRZI signal is set to a large value by the rules of the coding method. When such coding methods are used, the signal length TS=$2T_{max}$ of the synchronization code naturally becomes longer, too. When long synchronization codes such as this are frequently recorded with the desired information as control data for reproduction, the ratio of desired information to control data drops in the information recorded to the recording medium. As a result, this interferes with improving the recording density of the data on an optical disk.

Recent research in optical coding and recording techniques strives to transmit as much information as possible while limiting the NRZI signal inversion period to less than the upper frequency limit of the transmission path. The result of this coding method is an increase in the maximum inversion interval $T_{max}$. For example, the maximum inversion interval $T_{max}$ of the modulated NRZI signal is defined as 14T by the coding rules of the 8–15 conversion method whereby eight data bits other than the synchronization code are converted to code words expressed by a 15-bit pattern. If the signal length TS of the synchronization code remains $2T_{max}$ and the coding benefits described above are retained, the synchronization code is expressed by an NRZI signal of signal length TS=28T, significantly longer than the signal length of the synchronization code generally used today.

DISCLOSURE OF INVENTION

Therefore, the primary object of the present invention is to provide a recording medium to which information is recorded using a synchronization code that is reliably discernible from the other information while being recorded with a short signal length.

A further object of the invention is to provide new methods for transmitting and reproducing the information recorded with said synchronization code.

To achieve the aforementioned objects, an article of manufacture according to the present invention comprises a reproducer usable optical disk having a reproducer readable code embodied therein. The reproducer readable code in the article of manufacture comprises: synchronization codes provided along a track with an interval between two synchronization codes; and data codes (non-synchronization codes) filled in the interval between two synchronization codes. The data code is formed by a plurality of ON markings representing a first level of a binary code and OFF markings representing a second level of a binary code, a maximum length of a continuous marking in said data codes being limited to $T_{max}$, and a minimum length of a continuous marking in said data codes being limited to $T_{min}$. The synchronization code is formed by a plurality of ON markings representing a first level of a binary code and OFF markings representing a second level of a binary code. The synchronization code comprises an identifier having a continuous marking with a predetermined length $T_{max}+nT$ in which n is an integer equal to or greater than 2 and T is a unit length representing one binary code.

As a result, a code segment corresponding to the particular code sequence expressing the synchronization code appears at a regular interval in the area to which information containing said synchronization code is recorded to the recording medium. This particular code sequence is generated to contain a bit string of the one binary value for which the maximum number of consecutive bits is limited in a string length at least two bits longer than that maximum limit, and does not appear in the code other than the synchronization code ("non-synchronization code" or "data code") in the error correction range in which reading errors can be corrected. It is therefore possible for the reproduction apparatus to accurately discriminate the synchronization code from the other codes while reproducing the non-synchronization code from the recording medium. The reproduction apparatus can thus accurately read the first bit in the non-synchronization code information based on the synchronization code thus separated. Because the length of this synchronization code sequence can be set shorter than the conventional synchronization code, which is repeated twice separated by one bit of the binary value opposite that for which the maximum consecutive bit count is limited, an equivalent amount of information other than synchronization code information can be recorded to the recording medium, thus increasing the recording density of the recording medium.

According to the present invention, a data transmission method for transmitting an original data comprises the steps of:

(a) converting said original data to sequential data codes, said data code being formed by a combination of first level binary codes and second level binary codes, a maximum length of a continuous binary codes of one level in said data codes being limited to $T_{max}$, and a minimum length of a continuous binary codes of one level in said data codes being limited to $T_{min}$;

(b) generating a synchronization code, said synchronization code being formed by a combination of first level binary codes and second level binary codes, said synchronization code comprising an identifier having a continuous binary codes of one level with a predetermined length $T_{max}+nT$ in which n is an integer equal to or greater than 2 and T is a unit length representing one binary code;

(c) inserting said synchronization code intermittently in said sequential data codes.

According to the present invention, a data transmission apparatus for transmitting an original data comprises:

converting means for converting said original data to sequential data codes, said data code being formed by a combination of first level binary codes and second level binary codes, a maximum length of a continuous binary codes of one level in said data codes being limited to $T_{max}$, and a minimum length of a continuous binary codes of one level in said data codes being limited to $T_{min}$;

generating means for generating a synchronization code, said synchronization code being formed by a combination of first level binary codes and second level binary codes, said synchronization code comprising an identifier having a continuous binary codes of one level with a predetermined length $T_{max}+nT$ in which n is an integer equal to or greater than 2 and T is a unit length representing one binary code; and inserting means for inserting said synchronization code intermittently in said sequential data codes.

According to the present invention, a data reproduction method for reproducing an original data from a sequential data codes intermittently inserted with a synchronization code, said sequential data codes and synchronization codes being stored in an optical disk, said data code being formed by a combination of first level binary codes and second level binary codes, a maximum length of a continuous binary codes of one level in said data codes being limited to $T_{max}$, and a minimum length of a continuous binary codes of one level in said data codes being limited to $T_{min}$, said synchronization code being formed by a combination of first level binary codes and second level binary codes, said synchronization code comprising an identifier having continuous binary codes of one level with a predetermined length $T_{max}+nT$ in which n is an integer equal to or greater than 2 and T is a unit length representing one binary code;

said method comprising the steps of:

(a) detecting said identifier by detecting said continuous binary codes of one level;

(b) separating said synchronization code from said data code; and (c) re-converting data code to original data.

According to the present invention, a data reproduction apparatus for reproducing an original data from a sequential data codes intermittently inserted with a synchronization code, said sequential data codes and synchronization codes being stored in an optical disk, said data code being formed by a combination of first level binary codes and second level binary codes, a maximum length of a continuous binary codes of one level in said data codes being limited to $T_{max}$, and a minimum length of a continuous binary codes of one level in said data codes being limited to $T_{min}$, said synchronization code being formed by a combination of first level binary codes and second level binary codes, said synchronization code comprising an identifier having continuous binary codes of one level with a predetermined length $T_{max}+nT$ in which n is an integer equal to or greater than 2 and T is a unit length representing one binary code;

said apparatus comprising:

detecting means for detecting said identifier by detecting said continuous binary codes of one level;

separating means for separating said synchronization code from said data code; and re-converting means for re-converting data code to original data.

When the transmitted time-series information is read from the recording medium as an analog signal containing the time-series information, and the code sequence containing the synchronization code is read from that analog signal, continuous code sequences two or more bits longer than the maximum bit limit will not appear in any code sequence expressing the non-synchronization code information insofar as the read error of the read code sequence is within the error correction range. The data reproduction method of the present invention is therefore able to separate the synchronization code information from the non-synchronization code information with good precision in time-series transmitted information containing these synchronization code sequences, and based on the separated synchronization code, to reproduce with good precision the particular information transmitted immediately following the synchronization code.

The present application is based upon Japanese Patent Applications No. 7-77974 filed Apr. 3, 1995 and No. 7-267485 filed Oct. 16, 1995, the entire content of which are expressly incorporated by reference herein.

BRIEF DESCRIPTION OF DRAWINGS

The present invention will become more fully understood from the detailed description given below and the accompanying diagrams wherein:

FIG. 2 is a conversion table showing examples of 8–15 conversion used in the preferred embodiments of the invention;

FIG. 3 is a conversion table showing examples of 8–15 conversion used in the preferred embodiments of the invention;

FIG. 6 is a table showing the type information of the synchronization code according of the preferred embodiment, and the values of the corresponding code words;

DETAILED DESCRIPTION OF THE PREFERRED EMBODIMENTS

Figure 1:
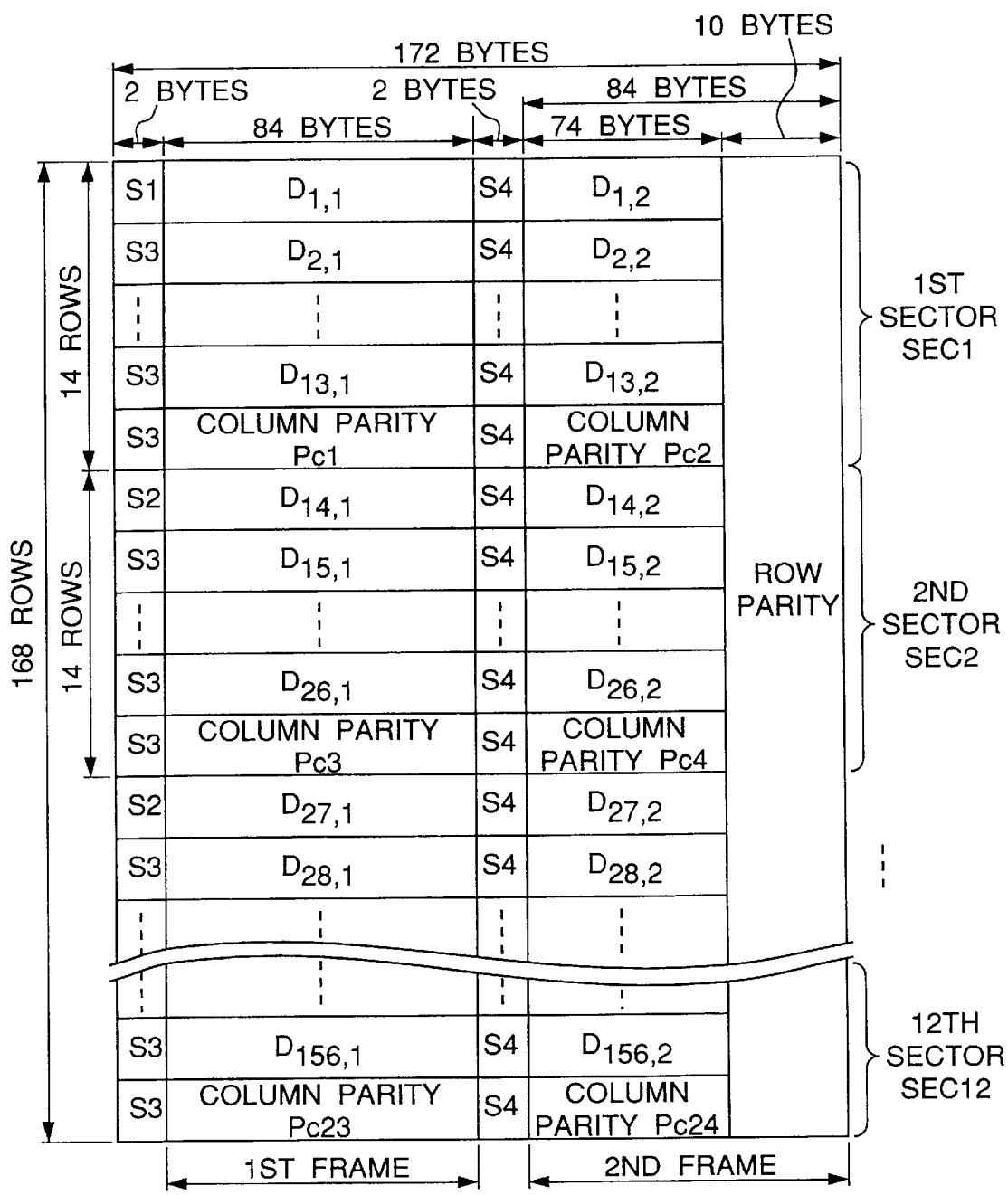
FIG. 1 is a diagram showing the data and synchronization code as the data to be written to a recording medium according to the first embodiment of the invention before modulation for recording.

A recording medium according to the present invention records non-synchronization code information, which is expressed by so-called run length limited code sequences in which the maximum number of bits of one binary value that may appear consecutively therein is limited, with synchronization code sequences inserted thereto at regular intervals. The synchronization code contains a code sequence of the single binary value (0 or 1) for which the maximum number of consecutive bits in the non-synchronization code information is limited in a bit string at least two bits longer than said maximum consecutive bit limit.

Therefore, in the recording medium according to the embodiment of the present invention, a code segment corresponding to the particular code sequence identifying part of the synchronization code appears at a regular interval in the region to which information also containing the synchronization code is recorded on the recording medium. This code sequence is a consecutive bit string of the one binary value for which the maximum consecutive bit limit is defined, and has a bit length at least two bits longer than said limit. The reproduction apparatus reproduces an analog signal from the recording medium, and reads a binary code sequence from the analog signal. Even if the threshold value varies at this time, because the code sequence identifying the synchronization code is defined as the code sequence described above, the code sequence identifying the synchronization code will not appear in the non-synchronization code information insofar as the read errors of the read code sequence are within the error correction range. The synchronization code thus discriminated from the non-synchronization code information identifies the separators inserted at a constant interval in the code sequences expressing the non-synchronization code information, and therefore also functions to identify the location of code sequences expressing particular information in the code sequences containing the synchronization code.

The recording medium according to the embodiment of the present invention, the code sequence containing said synchronization code is converted to a particular signal sequence. Said signal sequence holds one of two signal levels for the code value of which the maximum number of consecutive bits is limited, and inverts to the other signal level from the held signal level for other code values. The recording states corresponding to each signal level are recorded continuously to the recording medium according to the time the level is held, and the area to which the synchronization code is recorded has a period in which the same recording state continues for two or more bits longer than the period corresponding to the maximum consecutive bit limit.

Therefore, a continuous recording state that is at least two bits longer than the maximum consecutive bit limit appears at a constant interval in the region of the recording medium to which information containing the synchronization code is recorded.

The recording medium according to the embodiment of the present invention, the non-synchronization code information is expressed by code sequences for which maximum and minimum limits are defined for the number of consecutive bits of one of two binary values that may appear therein, and the synchronization code contains a particular code sequence of a particular bit length equal to the sum of the lengths of a first consecutive sequence and a second consecutive sequence contained therein and separated by one bit of the other binary value. Said first consecutive sequence is a bit string of the one binary code value for which a maximum consecutive bit limit is defined, and has a bit length at least two bits longer than the maximum consecutive bit limit. Said second consecutive sequence is of a length within the maximum consecutive bit limit.

In addition to the effects of the recording medium of the embodiment of the present invention, the length of the overall particular code sequence in a recording medium has a constant, known length even when the threshold value varies due, for example, to noise produced while reading the binary code sequence from the analog signal reproduced from the recording medium. Note that the first consecutive sequence of the particular code sequence is the code sequence in which the one code value continues for the greatest bit length in the code sequence containing the synchronization code. The code sequence corresponding to the particular code sequence can therefore be identified by finding the code sequence containing the longest consecutive string of the one bit value in the read code sequence even if the recording medium drive speed cannot be synchronized to reading the code sequence from the reproduced analog signal when the reproduction apparatus starts operating.

The difference between the defined overall length of the particular code sequence, and the length of the code sequence actually read as the code sequence corresponding to the particular code sequence, indicates that the recording medium drive speed is not synchronized to reading the code sequence from the analog signal. In other words, the predefined overall length of the particular code sequence functions as a reference for correcting synchronization error between code sequence reading from the analog signal, and the drive speed of the recording medium.

In the recording medium according to the embodiment of the invention, said second consecutive sequence is one bit longer than the defined minimum number of consecutive bits.

When reading the binary code sequence from the analog signal reproduced from the recording medium, the recording medium is resistant to error reading the overall length of the particular code sequence, even when the threshold value varies due to noise.

In the recording medium according to the embodiment of the present invention, said code sequence containing the synchronization code is converted to a particular signal sequence, said signal sequence holding one of two signal levels for the code value of which the maximum number of consecutive bits is limited, and inverting to the other signal level from the held signal level for other code values. The recording states corresponding to each signal level are recorded continuously to the recording medium according to the time the level is held. The area to which the synchronization code is recorded comprises adjacent first and second periods, and has a known length equal to the sum of the lengths of said first and second periods. Said first period records one recording state for a period two or more bits longer than the period corresponding to the maximum number of consecutive bits allowed in the non-synchronization code information, and said second period records another recording state for a period within the period corresponding to the maximum number of consecutive bits allowed in the non-synchronization code information.

In the recording medium according to the embodiment of the invention, the code sequence expressing the information other than the synchronization code is a code word sequence obtained by 8–15 conversion, said 8–15 conversion converting said code sequence into code words comprising a 15-bit code sequence inserted after every eight digital data bits.

The data transmission method according to the invention comprises a coding step for converting the non-synchronization code information to code sequences in which the maximum number of consecutive bits of one binary code value is limited; a synchronization code generating step for generating a synchronization code containing a sequence of the one binary value that is two or more bits longer than said maximum number of consecutive bits allowed in the non-synchronization code information; and a transmission step for inserting the generated synchronization code to the non-synchronization code information at a regular interval, and transmitting the resulting bit sequence in a time series. The data transmission method therefore has the following effects.

Any non-synchronization code information is converted by the coding step to code sequences in which the maximum number of consecutive bits of one binary code value is limited. Next, the synchronization code generating step generates a synchronization code containing a sequence of the one binary value that is two or more bits longer than said maximum number of consecutive bits allowed in the non-synchronization code information. Finally, the transmission step inserts the generated synchronization code to the non-synchronization code information at a regular interval, and transmits the resulting bit sequence in a time series. The code sequence transmitted by the transmission step is then extracted by the reproduction apparatus as an analog signal containing the desired information. Insofar as any read errors occurring while reading the code sequence from the analog signal are within the error correction range, the consecutive code sequence that is two bits longer than the maximum consecutive bit limit will not appear in any code sequence expressing information other than the synchronization code.

In the data transmission method according to the embodiment, the coding step converts the non-synchronization code information to a code sequence for which maximum and minimum limits are defined for the number of bits of one binary value that may appear consecutively in the non-synchronization code information; and the synchronization code generating step generates a synchronization code containing a particular code sequence of a particular bit length equal to the sum of the lengths of a first consecutive sequence and a second consecutive sequence contained therein and separated by one bit of the other binary value, said first consecutive sequence being a bit string of the one binary code value for which a maximum consecutive bit limit is defined, and having a bit length at least two bits longer than the maximum consecutive bit limit, and said second consecutive sequence having a length within the maximum consecutive bit limit. The data transmission method of the above therefore has the following effects.

Any non-synchronization code information is converted by the coding step to code sequences in which both the maximum and minimum numbers of consecutive bits of one binary code value are limited. Next, the synchronization code generating step generates a synchronization code containing a particular code sequence of a bit length equal to the sum of the lengths of a first consecutive sequence and a second consecutive sequence contained therein and separated by one bit of the other binary value, said first consecutive sequence being a bit string of the one binary code value for which a maximum consecutive bit limit is defined, and having a bit length at least two bits longer than the maximum consecutive bit limit, and said second consecutive sequence having a length within the maximum consecutive bit limit. The code sequence transmitted by the transmission step is then extracted by the reproduction apparatus as an analog signal containing the desired information, and even if the threshold value fluctuates when reading the code sequence from the analog signal, the defined overall length of the particular code sequence contained in the synchronization code will remain constant.

In the data transmission method of the embodiment, said second consecutive sequence is one bit longer than the defined minimum number of consecutive bits. When the code sequence transmitted by the transmission step is then extracted by the reproduction apparatus as an analog signal containing the desired information, and the threshold value varies when reading the code sequence from the analog signal, the defined length of the particular code sequence will be resistant to reading error, and the overall length of the particular code sequence can be set short.

The data reproduction method according to the embodiment is a method for reproducing non-synchronization code information from transmitted time-series information, said time-series information being transmitted after converting the non-synchronization code information to code sequences in which the maximum number of consecutive bits of one binary value is limited, and then inserting thereto at a regular interval a synchronization code containing a particular code sequence of said one binary value in a bit string that is two or more bits longer than said maximum number of consecutive bits. This data reproduction method comprises a discrimination step for identifying said particular code sequence in the code sequences read from the transmitted time-series information; and a particular information reading step for reading the code sequence written to a particular position in the identified particular code sequence as the code sequence expressing particular information.

The data reproduction method according to the embodiment thus operates as follows. The discrimination step identifies the particular code sequence in the code sequences read from the transmitted time-series information. The particular information reading step then reads the code sequence written to a particular position in the identified particular code sequence as the code sequence expressing particular information. The "code sequence written to a particular position in the identified particular code sequence" is an address expressed by type information in the synchronization code, a code word immediately after the synchronization code, and the code word sequence starting from that code word.

The data reproduction method according to the embodiment is a method for reproducing non-synchronization code information from transmitted time-series information, said time-series information being transmitted after converting the non-synchronization code information to code sequences in which the maximum and minimum numbers of consecutive bits of one binary value are limited, and then inserting thereto at a regular interval a synchronization code containing a particular code sequence, said particular code sequence having a particular bit length equal to the sum of the lengths of a first consecutive sequence and a second consecutive sequence contained therein and separated by one bit of the other binary value, the first consecutive sequence being a bit string of the one binary code value for which a maximum consecutive bit limit is defined, and having a bit length at least two bits longer than the maximum consecutive bit limit, and the second consecutive sequence having a length within the maximum consecutive bit limit. This data reproduction method comprises a discrimination step for identifying said particular code sequence in the code sequences read from the transmitted time-series information, and a particular information reading step for reading the code sequence written to a particular position in the identified particular code sequence as the code sequence expressing particular information.

The data reproduction method according to the embodiment thus operates as follows. The discrimination step identifies the particular code sequence in the code sequences read from the transmitted time-series information. The particular information reading step then reads the code sequence written to a particular position in the identified particular code sequence as the code sequence expressing particular information. The "code sequence written to a particular position in the identified particular code sequence" is an address expressed by type information in the synchronization code, a code word immediately after the synchronization code, and the code word sequence starting from that code word.

The data reproduction method according to the embodiment further comprises a clock generation step for generating a read clock; a read step for reading the time-series binary code sequence from the time-series information transmitted at a particular transmission speed synchronized to the generated read clock; a counting step for counting in the read time-series binary code sequence the one code value for which maximum and minimum consecutive bit limits are defined to determine the sum of the maximum consecutive bit count and the consecutive bit count on a particular side of the maximum consecutive bit count; and a frequency control step for controlling the frequency of the read clock in the clock generation step so that the counted total matches a predetermined value based on the overall length of the particular code sequence in the synchronization code. This data reproduction method is characterized by the discrimination step identifying the particular code sequence from the time-series binary code sequence read in the read step after the frequency is controlled in the frequency control step.

The data reproduction method of the embodiment thus operates as follows. First, the clock generation step generates a read clock. The read step then reads the time-series binary code sequence from the time-series information transmitted at a particular transmission speed synchronized to the generated read clock. The counting step then counts the one code value for which maximum and minimum consecutive bit limits are defined in the read time-series binary code sequence to determine the sum of the maximum consecutive bit count and the consecutive bit count on a particular side of the maximum consecutive bit count. The difference between this counted total and a value predefined according to the overall length of the particular code sequence expresses the synchronization error between the read clock frequency and the transmission speed of the time-series information. The frequency control step therefore controls the frequency of the read clock in the clock generation step so that the counted. total matches a predetermined value based on the overall length of the particular code sequence in the synchronization code. After the read clock frequency is controlled in the frequency control step, the discrimination step identifies the particular code sequence from the time-series binary code sequence read in the read step.

The data reproduction method of the embodiment further comprises a drive step for driving the recording medium to which the information to be transmitted is recorded;

a reproduction step for reproducing an analog reproduction signal from the recording medium based on the drive speed; a clock generation step for generating a read clock; a read step for reading the time-series binary code sequence from the analog reproduction signal synchronized to the generated read clock; a counting step for counting in the read time-series binary code sequence the one code value for which maximum and minimum consecutive bit limits are defined to determine the sum of the maximum consecutive bit count and the consecutive bit count on a particular side of the maximum consecutive bit count; and a drive speed control step for controlling the recording medium drive speed in the drive step so that the counted total matches a value predetermined based on the overall length of the particular code sequence in the synchronization code. This data reproduction method is characterized by the discrimination step identifying the particular code sequence from the time-series binary code sequence read in the read step after the drive speed is controlled in the drive speed control step.

The data reproduction method according to the embodiment thus operates as follows. First, the drive step drives the recording medium to which the information to be transmitted is recorded. The reproduction step then reproduces an analog reproduction signal from the recording medium based on the drive speed. The clock generation step generates a read clock. The read step then reads the time-series binary code sequence from the analog reproduction signal synchronized to the generated read clock. The counting step then counts in the read time-series binary code sequence the one code value for which maximum and minimum consecutive bit limits are defined to determine the sum of the maximum consecutive bit count and the consecutive bit count on a particular side of the maximum consecutive bit count. The difference between this counted total and a value predefined according to the overall length of the particular code sequence expresses the synchronization error between the read clock frequency and the drive speed of the recording medium. The drive speed control step therefore controls the recording medium drive speed in the drive step so that the counted total matches a value predetermined based on the overall length of the particular code sequence in the synchronization code. After the drive speed is controlled in the drive speed control step, the discrimination step identifies the particular code sequence from the time-series binary code sequence read in the read step.

Embodiment 1

FIG. 1 is a data table showing the data and synchronization code to be written to a recording medium according to the first embodiment of the invention; the data and synchronization code are shown before data modulation.

Data is written to the optical disk in data blocks (the error correction processing unit) of 168×168 bytes not including the synchronization code. FIG. 1 is a conceptual data table showing the data in one data block in a hypothetical two-dimensional array.

Each row in this 2D data block array is identically formatted. More specifically, each row in the block comprises a synchronization code (2 bytes), data frame 1 (84 bytes), another synchronization code (2 bytes), and data frame 2 (84 bytes). Each row starts with synchronization code S1, S2, or S3 written before data frame 1, to which data D1,1, D2,1, . . . D156,1 is written. Synchronization code S4 is then written before data frame 2, to which data D1,2, D2,2, ... D156,2 is written. A 10-byte parity code Pr corresponding to the data in the two frames written to the same row is written to the last ten bytes of the data written to data frame 2.

Each block comprises twelve sectors SEC1-SEC12 each comprising fourteen rows as shown in FIG. 1 in this example. The sector address is written at the beginning of each sector to the data area of the data frame following synchronization code S1 or S2.

Synchronization code S1 is written immediately before data frame 1 in sector SEC1 at the beginning of the block, and thus identifies the beginning of a data block. Synchronization code S2 is written immediately before data frame 1 at the beginning of the first row in each sector other than sector SEC1 at the beginning of the first block, and identifies the start of a data sector. Synchronization code S3 is written immediately before data frame 1 in rows 2–14 of every sector, and identifies the start of each new row other than the first row in the block or sector. Synchronization code S4 is written immediately before data frame 2 in every row, and identifies the approximate middle of each row.

The fourteenth row of each sector is the column parity row Pc. A 12-byte parity code is written for each 156 data bytes collected columnwise from rows 1–13 in each sector (corresponding to 12 bytes per row (12×13=156)), and the seven 12-byte parity codes are written byte by byte to the parity row Pc1–Pc4 (row 14) in the corresponding column. The parity rows written to row 14 of each sector are used for error correction processing after all data in one block is read.

The data blocks thus formatted are converted to code words by 8–15 conversion as described below, and then modulated with NRZI modulation for writing to an optical disk or other recording medium. Note that the synchronization codes S1–S4 are converted to code sequences of which the identifier is expressed by a pattern that will not appear in the data frame (i.e., the data being recorded) according to the coding rules used for 8–15 conversion.

FIGS. 2 and 3 are conversion tables showing an example of the 8–15 conversion used in this embodiment of the invention.

As shown in FIGS. 2 and 3, the 8–15 conversion method of this embodiment assigns at least one code word expressed by a 15-bit pattern for each 8 data bits (1 byte). In the table of FIGS. 2 and 3, the MSB of the 15-bit pattern serves as a merging bit for connecting the code words. All the merging bits are shown as 0, but can be changed to 1 in accordance with a DC control. The detail of the DC control is disclosed in U.S. Pat. No. 4,728,929 to S. Tanaka issued Mar. 1, 1988, which is herein incorporated by reference.

The code words converted by this 8–15 conversion method are generated so that a maximum of thirteen (or twelve) and a minimum of two zeroes [0] occur consecutively between 1s in any consecutive code word sequence. Thus, when the code word sequence is expressed by the inversion periods of the NRZI signals corresponding to the code words, the maximum inversion period $T_{max}$ is 14T (or 13T) and the minimum inversion period $T_{min}$ is 3T where T is the length of one code word bit. Note that the code words are controlled so that the maximum and minimum numbers of consecutive 0s between 1s satisfy these $T_{max}$ and $T_{min}$ parameters even in the junctions between code words.

Figure 4:
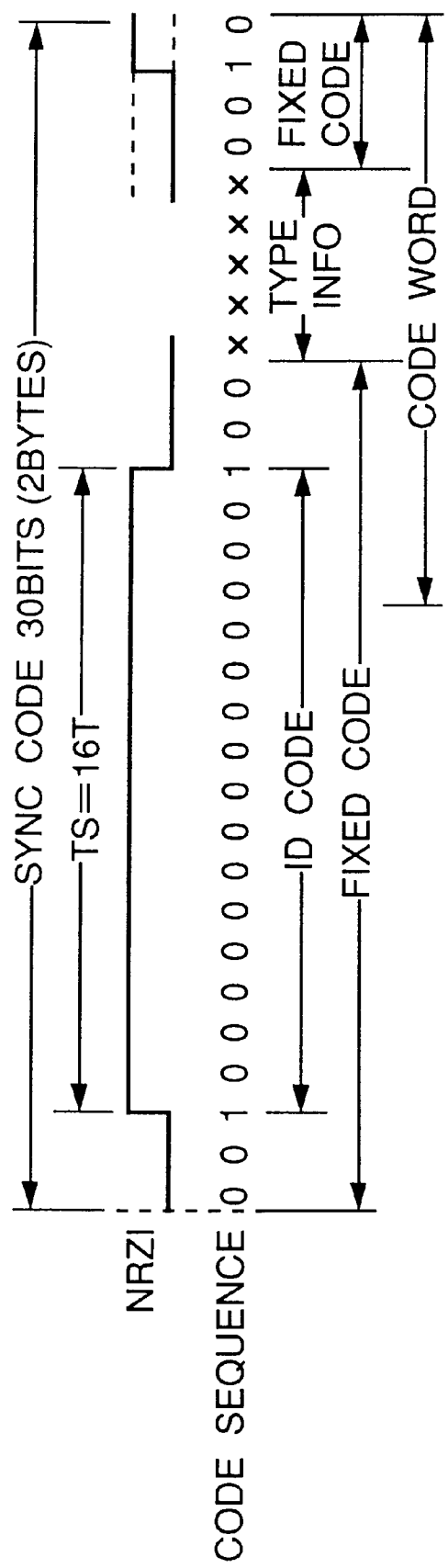
FIG. 4 is a diagram showing the data structure of the synchronization codes S1–S4 in the preferred embodiments of the invention.

FIG. 4 is used to describe the data structure of the synchronization codes S1–S4 in this embodiment of the invention. Note that in FIG. 4 "x" represents bits with a code value of either zero (0) or one (1).

The synchronization codes S1–S4 have a data length of two bytes, expressed by a 30-bit code sequence. Each synchronization code comprises an identifier for discriminating the synchronization code from other data, and type information identifying the location in the data block to which the synchronization code is inserted.

The identifier is a code sequence of fifteen zeroes (0) preceded and followed by a one (1) on each end, i.e., is expressed in the NRZI-modulated signal as inversion interval $TS=T_{max}+2T$ (or $T_{max}+3T$)=16T. Note that this code sequence and inversion interval only appear in the synchronization code, i.e., do not appear in the code words expressing data other than the synchronization codes (i.e., "non-synchronization code data") or in the corresponding NRZI signal.

The type information is expressed by the five bits from bit 22 to bit 26 of the synchronization code. Note, further, that only the type information may vary in the synchronization code, and all other parts of the synchronization code are fixed code sequences common to every synchronization code. The fixed code sequences are also defined to satisfy the 8–15 conversion coding rules where the synchronization code and the non-synchronization code data meet.

The 15-bit code sequence occupying the second half of the synchronization code is a code sequence selected that also exists as a code word generated by 8–15 conversion. This 15-bit code sequence is one code word, the smallest data unit of the 8–15 conversion method, and the smallest data read unit of the 8–15 conversion is therefore also defined as 15 bits. As a result, the 5-bit type information cannot be read alone as meaningful data unless a new data format for reading 5-bit code sequences is defined. Therefore, by defining the last 15-bit code sequence in the synchronization code as one code word, the code word containing the type information can be read in the same manner as the other data during 8–15 reverse conversion of the signal reproduced from the recording medium.

Instead of the 8–15 conversion, it is possible to use a 8–16 conversion.

The selection of the bit lengths $T_{max}$ and $T_{min}$ will be further explained below.

When the NRZI signal, such as shown in FIG. 7(c) is recorded on an optical disk or other recording medium, a pit or a marking is formed along a disk track correspondingly to a HIGH level portion of the NRZI signal, and no pit or no marking is formed correspondingly to a LOW level portion. Since the pits or the markings are formed, for example, by the laser beam, it is necessary to limit the length of such pits or such markings and the interval length therebetween as explained next. If the length of the marking or the marking interval is relatively long, the stability of the PLL control necessary for producing the read clock will be decreased, resulting in wider variation of the reproduced signal level after a high pass filter. Also, if the laser beam is radiated for a relatively short term, no pit or no marking will be formed on the disk, or the pit or marking will be too small to read.

For these and other reasons, according to the present invention, a pit or a marking for the data (such as video and/or audio data) has the maximum pit length or the maximum marking length $T_{max}$ of 14T (or 13T), a special pit or a special marking for an identifier in the synchronization code has the pit length TS which is equal to $T_{max}+nT$ in which n is an integer equal to or greater than 2 and T is a unit length representing one binary code. According to one embodiment, n=2, and according to a preferred embodiment, n=3. By selecting the pit or marking length of the identifier longer than any pit or marking in the data, it is possible to discriminate the identifier from the data.

Also according to the present invention the minimum pit length or the minimum marking length $T_{min}$ for a pit or a marking for data and for synchronization code is determined as 3T.

Figure 5:
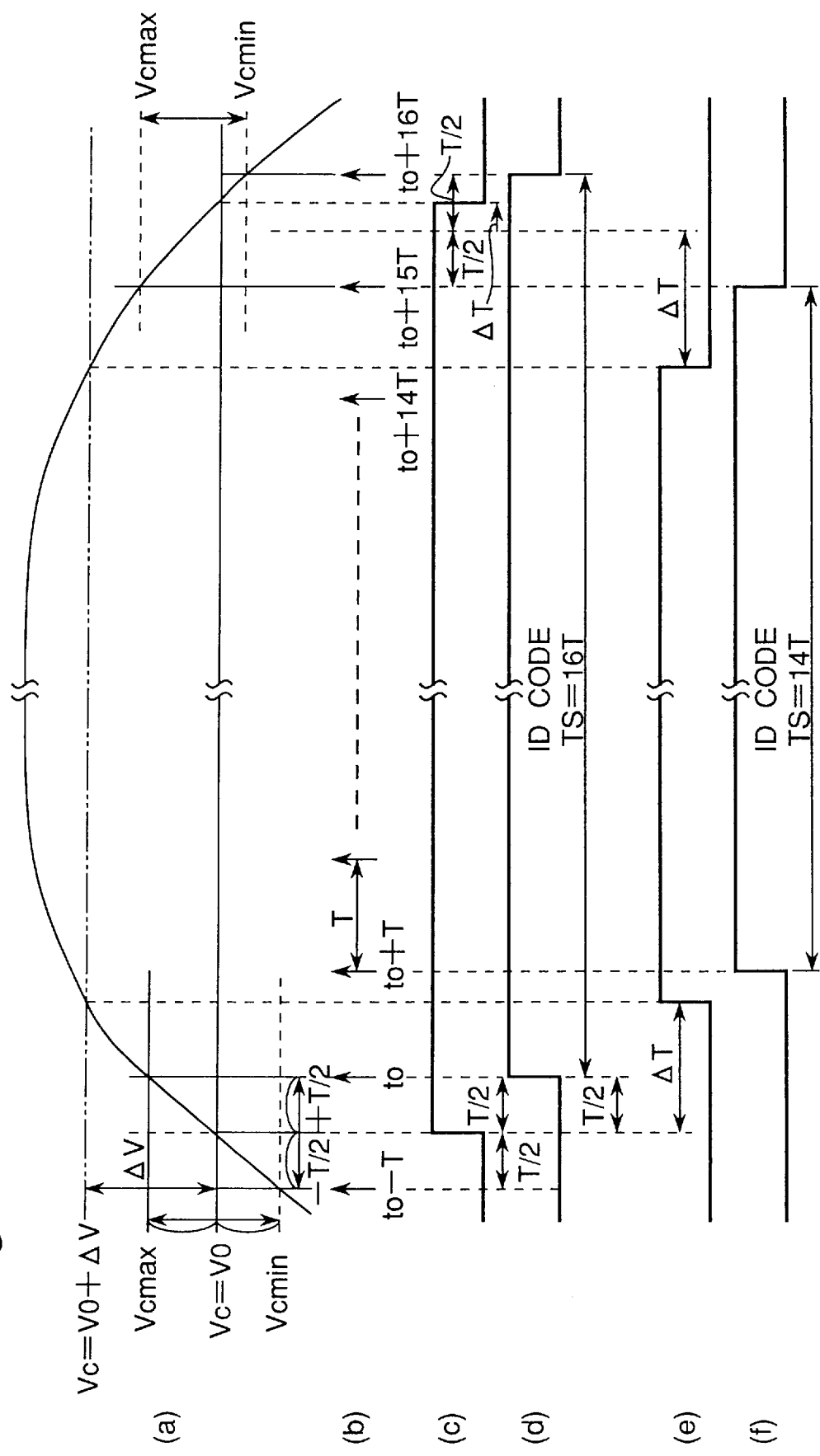
FIG. 5 are diagrams (a)–(F) showing the relationship between the reproduction signal reproduced from an optical disk according to the present embodiment, and the NRZI signal read from the reproduction signal.

FIG. 5 is used to describe the relationship between the reproduction signal reproduced from an optical disk according to the present embodiment, and the NRZI signal read from the reproduction signal. FIG. 5(a) shows the reproduction signal reproduced for the synchronization code identifier, and the read threshold value $V_c$ therefor. FIG. 5(b) shows the read clock supplied at bit interval T. FIG. 5(c) shows the comparator output signal when the reproduction signal and the read threshold value $V_c=V_0$ are input. FIG. 5(d) shows the NRZI signal obtained by sampling the comparator output signal shown in FIG. 5(c) at the read clock shown in FIG. 5(b). FIG. 5(e) shows the comparator output signal when the reproduction signal and a read threshold value $V_c$ exceeding the tolerance range ($V_c=V_0+\Delta V$) are input. FIG. 5(f) shows the NRZI signal obtained by sampling the comparator output signal shown in FIG. 5(e) at the read clock shown in is FIG. 5(b). Note that the comparator output signal inverts to a HIGH level at the intersection of the reproduction signal and the read threshold value $V_c$, and the NRZI signal in FIG. 5(d) inverts from a LOW to a HIGH level at time $t_0$.

The reproduction signal reproduced from the recording medium is obtained as an analog signal as shown in FIG. 5(a). The reproduction signal is therefore converted to a digital signal by means of the comparator converting values equal to or greater than the read threshold value $V_c$ to HIGH bits, and values below the read threshold value $V_c$ to LOW bits. The digitized comparator output signal is then sampled at the read clock timing shown in FIG. 5(b), generating the NRZI signals shown in FIGS. 5(d) and (f). The read clock phase and read threshold value are controlled so that the comparator output signal inverts at a particular reference position, which is defined here as the median between the current read clock and the next read clock. However, when the read threshold value $V_c$ is not stable, such as at the start of reproduction signal reading, the read threshold value $V_c$ will vary as shown in FIG. 5(a). This variation in the read threshold value $V_c$ appears as offset $\Delta T$ from the reference position of the timing at which the comparator output signal inverts.

If the NRZI signal shown in FIG. 5(d) is the result of correct signal reading, the tolerance range $V_{cmin}$ to $V_{cmax}$ for variation in the read threshold value $V_c$ (i.e., the range in which NRZI signal read errors do not occur) must be in the range $-(T/2) < \Delta T \leq (T/2)$, shown from time (t0−T) to time t0 in FIG. 5(a), where $\Delta T$ is the offset from the reference position of comparator output signal inversion timing. As shown in FIG. 5(c), the comparator output signal inversion timing is within the tolerance range $-(T/2) < \Delta T \leq (T/2)$ from time (t0+15T) to time (t0+16T), producing offset $\Delta T$ from the reference position. The correct sampling value can therefore be obtained by the read clock at time (t0+16T).

However, when the offset $\Delta T$ from the inversion timing reference position of the comparator output signal exceeds the tolerance range expressed as $-(T/2) < \Delta T \leq (T/2)$ due to read threshold value $V_c$ fluctuation, the inversion interval is offset (shifted) ±T at the NRZI signal rise and ±T at the NRZI signal drop.

Therefore, when the relative variation in the read threshold value $V_c$ to the reproduction signal temporarily exceeds the read threshold value $V_c$ tolerance range due, for example, to noise, the inversion position of the NRZI signal expressing the synchronization code and data shifts one bit (±T). In other words, the position of the 1 in the code sequence of the corresponding code word sequence shifts 1 bit to the adjacent code bit. There is a high probability that data read errors of this type can be properly corrected by the error correction process of the reproduction apparatus. Conversely stated, if the optical disk reproduction apparatus is not designed with tolerance sufficient to correct 1-bit shifts in the inversion position occurring at a normal frequency due to noise or other factors, the optical disk reproduction apparatus will not be able to withstand everyday use. It can therefore be assumed that the inversion interval of the reproduced NRZI signal will virtually never shift 2T or greater due to factors such as noise.

It is possible in this case that the maximum inversion interval $T_{max}$=14T in the NRZI signals for non-synchronization code data may be read as an interval of 13T or 15T, but there is virtually no possibility that it will be read as 12T or 16T. It is also possible that the inversion interval TS=16T of the synchronization code identifier will be read as a 15T or 17T interval. In this case, however, because there is no signal segment that inverts with an inversion interval of 16T or greater in the NRZI signals expressing non-synchronization code data, the non-synchronization code data and synchronization code can be correctly identified by determining that any signal segment with an inversion interval of 16T or greater is a synchronization code identifier. The identifier for a synchronization code read with a 15T inversion interval will not be valid at this time, but the invalidated synchronization code is prevented from being read as non-synchronization code data by a separate determination cross-referencing the periodicity of the synchronization code in the NRZI signal.

However, if the change in the read threshold value $V_c$ above the tolerance range is sustained at $V_c = V0 + \Delta V$ as shown by the double-dot-dash line in FIG. 5(a), a read error of inversion interval T will occur at the inversion part of the NRZI signal at both ends of the synchronization code identifier, and in the data following that synchronization code, as shown in FIG. 5(f). When this happens, a signal segment with a 16T inversion interval, i.e., a signal segment that should not occur in the non-synchronization code data, occurs in the non-synchronization code data. As a result, by determining any signal segment with an inversion interval of 16T or greater to be the synchronization code identifier, the reproduction apparatus determines an indeterminate part of data that is not the synchronization code data to be the beginning of some frame, thereby disrupting the data read synchronization timing, and preventing any subsequent data from being read. Even if the synchronization is not disrupted, the probability is low that the read errors resulting from the reproduced data will be correctable by the error correction process. As a result, optical disk readers detect a data read problem when plural signal segments with an inversion interval of 18T or greater are detected, and execute an appropriate process.

By thus defining the length of the inversion interval TS of the synchronization code identifier as TS=$T_{max}$+2T or greater, the synchronization code can be accurately discriminated from the non-synchronization code data within the data read range. Furthermore, by defining the length of the inversion interval TS of the synchronization code identifier as TS=$T_{max}$+2T or greater, the length of the synchronization code identifier can be shortened compared with an inversion interval TS of $2T_{max}$ as in the synchronization code of the prior art, and this difference can be used to include other type information adding a variety of other functions in the synchronization code. Moreover, because the overall length of the synchronization code can be set to twice the code word length, the first and second halves of the synchronization code can be separated in the same way as reading the code words expressing non-synchronization code data, and the type information written to the code word constituting the second half of the synchronization code can be read in the same way the code words expressing the non-synchronization code data can be read.

FIG. 6 is another data table showing the type information of the synchronization code according of the present embodiment, and the read values of the corresponding code words.

The type information written to the five bits from bit 22 to bit 26 of the synchronization codes S1–S4 formatted as shown in FIG. 4 identify the location in the data block to which the synchronization code is inserted. Synchronization code S1 indicates that said synchronization code S1 is inserted at the beginning of the data block, i.e., at the beginning of sector SEC1, by using type information 1 (10010) or type information 2 (00010). Synchronization code S2 likewise indicates that said synchronization code S2 is inserted at the beginning of any sector other than the first sector in the data block, i.e., to sectors SEC2–SEC14, by using type information 1 (01001) or type information 2 (01000). Synchronization code S3 likewise indicates that the synchronization code is inserted at the beginning of any row other than the first row in any sector by using type information 1 (10001) or type information 2 (10000). Synchronization code S4 indicates that the synchronization code is inserted in the beginning of data frame 2 starting from the middle of any row by using type information 1 (00000) or type information 2 (00001).

As also shown in FIG. 6, the type information is read by reading the normal code word unit containing the type information. For example, the type information 1 (10010) of synchronization code S1 is inserted to the five bits from bit 22 to bit 26 of the synchronization code as shown in FIG. 4. The code pattern of the synchronization code S1 containing this type information 1 code (10010) is therefore (0010000000000000000100100100010), and the code word containing this type information 1 code (10010) in this synchronization code S1 is (000100100100010). As a result, the code word part of the synchronization code S1 containing the type information 1 code 10010 is read as 114 as shown in the 8–15 data conversion table in FIG. 2. The code word part of a synchronization code S1 containing the type information 2 code 00010 is similarly read as a value of 86. If the code word read immediately after recognizing the synchronization code identifier is 114 or 86, the identified synchronization code is known to be the synchronization code S1 inserted to the beginning of the block. Synchronization codes containing other type information are recognized in the same manner.

Note that while type information codes 1 and 2 indicate the same synchronization code insertion position, the number of ones contained in the five type information bits is even in type information code 1, and odd in type information code 2.

Figure 7:
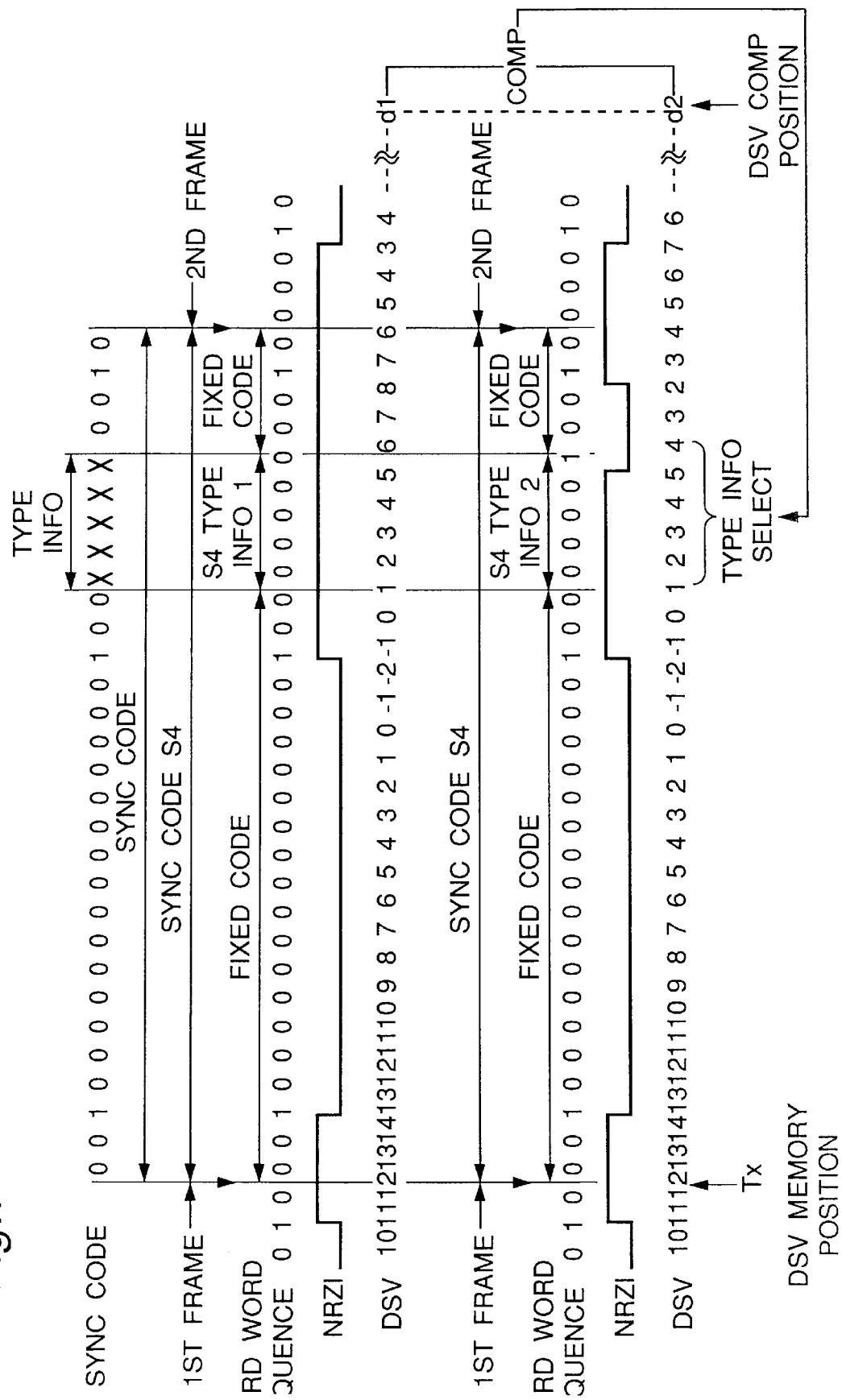
FIG. 7 are diagrams (a)–(F) showing the method of selecting type information code 1 or type information code 2 in the synchronization code in the preferred embodiments of the invention.

FIG. 7 is used to describe the method of selecting type information code 1 or type information code 2 in the synchronization code of this embodiment. Note that the method for selecting the type information codes 1 and 2 for synchronization code S4 is shown in FIG. 7 by way of example only, and the same method is used to select the type information codes 1 and 2 for synchronization codes S1–S3. Note also that synchronization code S4 is inserted between frames 1 and 2 as shown in FIG. 1.

FIG. 7(a) shows the code pattern common to all synchronization codes. FIG. 7(b) shows the change in the digital sum variation (DSV) when type information code 1 is selected as the type information for synchronization code S4. FIG. 7(c) shows the change in the digital sum variation (DSV) when type information code 2 is selected as the type information for synchronization code S4. The DSV is the value per unit time obtained by adding +1 if the NRZI signal wave is a HIGH level, and adding −1 if the wave is a LOW level, and expresses the bias in the dc component of the NRZI signal. Note also that the DSV is a value added cumulatively from a particular position in the data to be recorded, e.g., from the beginning of the data to be recorded, or from the beginning of the block.

As shown in FIG. 1, synchronization code S4 is inserted between data frames 1 and 2 in each row. To determine which type information 1 or 2 is appropriate to synchronization code S4, the DSV value is added cumulatively from the beginning of the data to be recorded to the end of the first frame, i.e., the position immediately before the insertion point of synchronization code S4. A DSV memory stores at time point Tx (FIG. 7) the level of the NRZI signal and the DSV value, and in the case shown in FIG. 7, the DSV memory stores HIGH level and d=12. The DSV value d1 at a particular DSV comparison point in frame 2 is then calculated using as the type information inserted to the synchronization code S4 type information 1 (00000). Type information 2 (00001) is then substituted for type information 1, and the DSV value d2 at said DSV comparison point in frame 2 is calculated. The calculated DSV values d1 and d2 are then compared, and the type information yielding the lowest absolute value of the DSV at the DSV comparison point in frame 2 is selected and inserted to the synchronization code S4.

The DSV values up to the fifth bit at the beginning of frame 2 are 4 using type information 1 as shown in FIG. 7(b), and 6 using type information 2 as shown in FIG. 7(c). The DSV values continue to be calculated to the particular DSV comparison position in frame 2, however, and the absolute values of the DSV values are compared at the DSV comparison point to select the type information whereby said absolute value is smallest. As a result, bias in the dc component can be suppressed when data is written to the recording medium using the format shown in FIG. 1. Moreover, when compared with the common method of suppressing bias in the dc component by inserting to the data a separate code sequence for suppressing dc component bias, dc component bias can be suppressed using the type information expressing the synchronization code type. The length of the code sequence inserted for dc component bias suppression can therefore be shortened, and the data storage area of the recording medium can be more effectively utilized.

As described above, the reproduction apparatus according to the present invention can easily identify the beginning of the data block by reading synchronization code S1, and can achieve a robust error correction processing capability using the data written to one data block as the error correction processing unit.

The location of frame 1, to which each sector address in that block is written, can also be easily identified by reading synchronization code S2. It is therefore possible to read the data from a specific block in a short time even when a specific block is accessed and reading starts from some midpoint in that block by reading the sector address following the synchronization code S2 at the beginning of the next immediate sector, temporarily buffering the data from that sector to the last sector in the targeted block to memory, then reading the data from the beginning of the targeted block to the initially accessed sector (i.e., the remaining sectors in that block), and inserting this data before the data buffered to memory.

Furthermore, because the location of the frame to which the sector address is written can be easily identified, the desired tracks can be accessed while reading only the addresses, and high speed searching can be achieved.

It is also possible with synchronization codes S1–S4 to recognize the first code word bit in each frame, and correct bit shifting in the reproduced data resulting from bit loss caused by signal dropout during data reproduction, for example.

A signal segment in which the inversion interval TS of the NRZI signal corresponding to the synchronization code identifier is $TS=(T_{max}+2T)$ has been used by way of example in the above embodiment, but a signal segment in which said inversion interval $TS=(T_{max}+3T)$ may be alternatively used. Even if the read threshold value $V_c$ temporarily varies outside the tolerance range, and the inversion interval shifts ±T in part of the read NRZI signals, the maximum inversion interval $T_{max}$, of the NRZI signal expressing the non-synchronization code data will be $$T_{max}-T \leq T_{max'} \leq T_{max}+T,$$

and the inversion interval TS' of the NRZI signal read as the synchronization code identifier will be $$T_{max}+2T \leq TS' \leq T_{max}+4T.$$

The inversion interval TS of the NRZI signal corresponding to the synchronization code identifier can be considered as the pit or marking length formed on a disk, or as an interval length of such pits or markings. According to the present invention, the pit length TS of the identifier is $(T_{max}+2T)$ or greater, but is best when it is $(T_{max}+3T)$, as explained below.

During reading or writing (herein after only the reading case is explained, but also applied to the writing case) a pit or a marking (herein after generally referred to as a marking, but understood as including both pit and marking and any other type of markings such as a projection) on the disk, it is known that the marking length $T_{max}$ may be erroneously read as $(T_{max} \pm T)$.

When the marking length TS of the identifier is $(T_{max}+2T)$, this can be erroneously read as $(T_{max}+2T) \pm T$ which is equal to $(T_{max}+T)$ or $(T_{max}+3T)$. And, under the same condition, the maximum data marking length $T_{max}$ can be erroneously read as $(T_{max} \pm T)$ which is equal to $(T_{max}-T)$ or $(T_{max}+T)$. In this case, by accepting the markings with a marking length not only $(T_{max}+2T)$, but also $(T_{max}+3T)$ as the identifier, it is possible to discriminate between the identifier markings and the maximum markings in the data with a higher reliability than by accepting only the marking with a marking length $(T_{max}+2T)$ as the identifier. In this case, the identifier that has been erroneously read as $(T_{max}+T)$ is disregarded, because this can not be distinguished with the maximum marking in the data that has been erroneously read as $(T_{max}+T)$ When the marking length TS of the identifier is $(T_{max}+3T)$, this can be erroneously read as $(T_{max}+3T) \pm T$ which is equal to $(T_{max}+2T)$ or $(T_{max}+4T)$. And, under the same condition, the maximum data marking length $T_{max}$ can be erroneously read as $T_{max} \pm T$ which is equal to $(T_{max}-T)$ or $(T_{max}+T)$. In this case, the markings with a marking lengths $(T_{max}+2T)$, $(T_{max}+3T)$ and $(T_{max}+4T)$ can be used as the identifier, and yet it is possible to distinguish between the identifier markings and the maximum markings in the data. Thus, the discrimination between the identifier markings and the maximum markings in the data can be made with a higher accuracy when the marking length TS of the identifier is made $(T_{max}+3T)$ rather than $(T_{max}+2T)$.

By determining the signal segment where the inversion interval of the read NRZI signal is $(T_{max}+2T)$ or greater to be the synchronization code identifier, the synchronization code can be correctly distinguished from the non-synchronization code data, the number of invalid synchronization codes can be decreased, virtually all of the synchronization codes can be correctly identified, and the start of the frame can be identified. It is therefore possible to more precisely correct any data bit shifting resulting from code bit loss caused by, for example, signal dropout during reproduction. When the read threshold value $V_c$ continues to range outside the tolerance range, it is also possible to detect abnormal signal reading, i.e., a read problem, by detecting signal segments in which the NRZI signal inversion interval is $(T_{max}+5T)$ or greater.

It is to be noted that the five bit type information described above shall not be limited to the correspondence between bit patterns and type information content as described above. More specifically, type information 1 and type information 2 are bit pattern pairs in which one bit pattern contains an odd number of ones (1) and the other pattern contains an even number of ones (1) in a pattern of five bits, and any patterns can be used insofar as the code word part of the synchronization code containing the type information is a pattern that is also found in the code word patterns. The type information may also be placed at the front of the identifier.

It should also be noted that the type information selection method described above calculates the DSV values from the beginning of the data to be recorded to a particular position in the frame immediately following the synchronization code to which the type information is inserted, and selects the type information whereby the absolute value of the DSV is smallest. The DSV calculation range that is the reference for selecting the type information is not, however, thus limited.

Specifically, it is also possible to cumulatively add the DSV values from the beginning of the block (or from the beginning of the frame immediately before the synchronization code, or from a particular position in the frame immediately before the synchronization code) to immediately before the synchronization code; calculate the DSV value to a particular position in the frame following the synchronization code using the synchronization code containing type information 1 and then recalculating the DSV value using the synchronization code containing type information 2; and then select the type information whereby the absolute value of the DSV value calculated to a particular position in the frame following the synchronization code is smallest.

Figure 18:
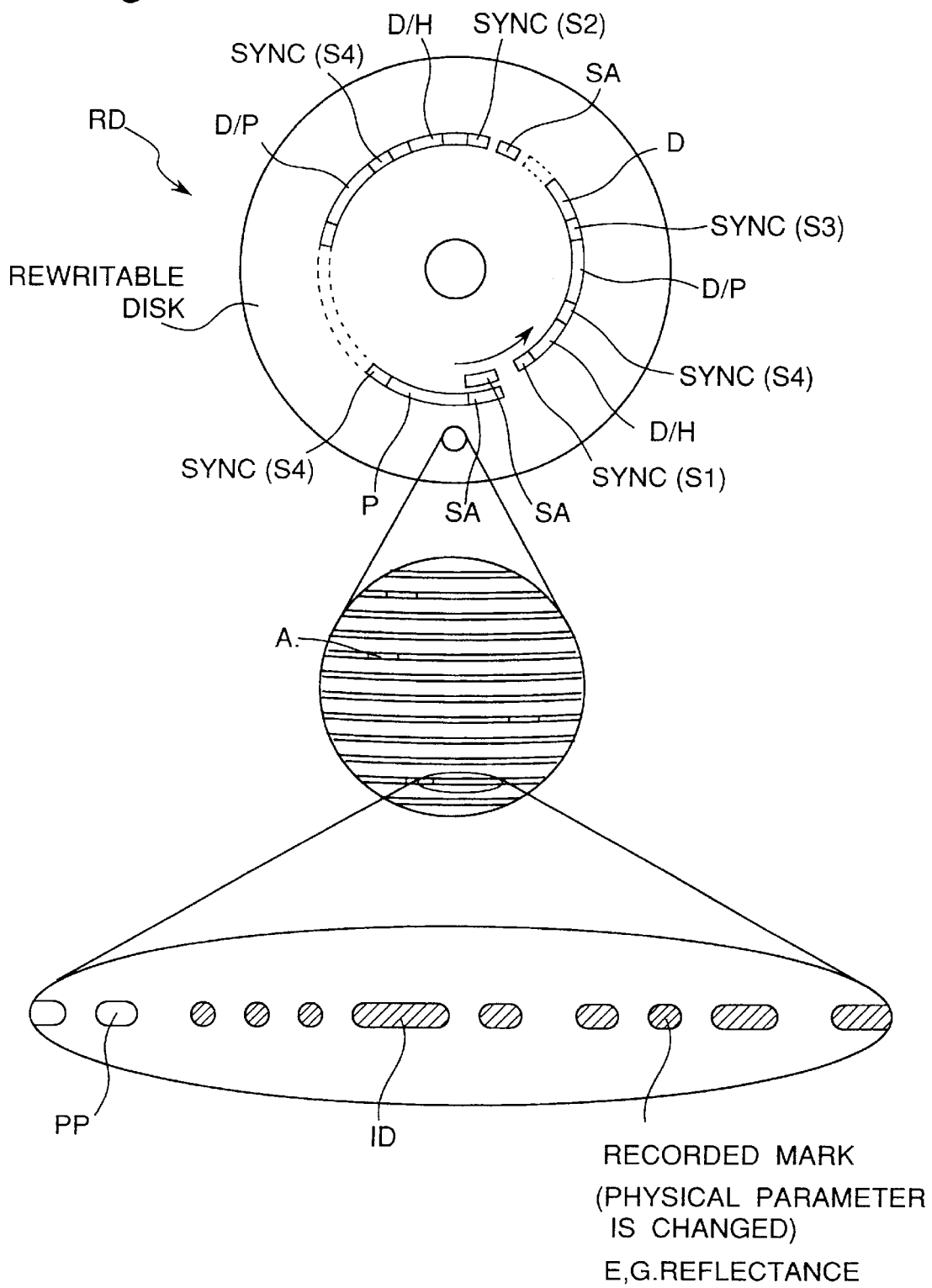
FIG. 18 is a plan view of an optical recording disk of a rewritable type particularly showing an arrangement of the markings according to the present invention.
Figure 19:
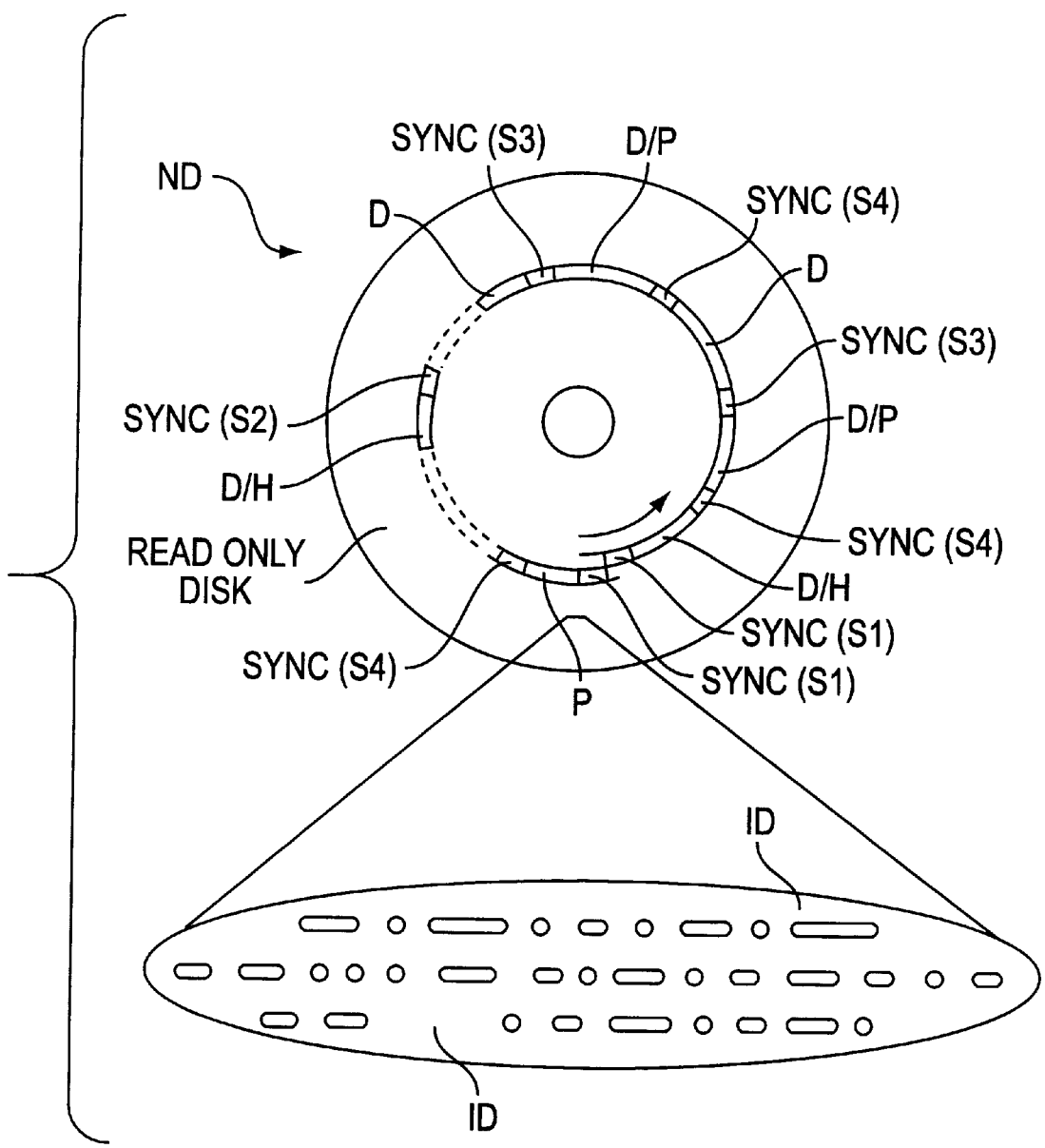
FIG. 19 is a plan view of an optical recording disk of a non-rewritable type particularly showing an arrangement of the markings according to the present invention.

FIGS. 18 and 19 show optical disks recorded with the NRZI signal according to the present invention. The optical disk shown in FIG. 18 is a rewritable disk RD (CAV), and the optical disk shown in FIG. 19 is a non-rewritable disk ND (CLV), i.e., a read only disk.

Referring to FIG. 18, the data stored in the rewritable disk RD is arranged as explained below.

A new rewritable disk RD without any recording has embossed with pre-pits along a track at predetermined locations. These pre-pits serve as addresses for accessing the disk. The recording is carried out by a laser beam which makes ON and OFF markings along the track. The markings may be done by changing the physical parameter, such as reflectance, of the disk surface. ON marking is the place where such a physical change is added, and OFF marking is the place where no such a physical change is added. As shown at the bottom of FIG. 18, according to a preferred embodiment of the present invention, the longest marking is the marking for the identifier ID which has a length of 14T. It is to be noted that in FIG. 18, the identifier ID is shown as formed by ON marking, but can be formed by OFF marking (a marking between two ON markings).

As shown in FIG. 18, in the rewritable disk RD, the recorded codes along the tracks are: sector address SA; synchronization code S1; data (such as video and audio data) and header codes D/H; synchronization code S4; data and parity codes D/P; synchronization code S3; data D; . . . sector address SA; synchronization code S2; data and header D/H; synchronization code S4; data and parity codes D/P; . . . synchronization code S4; and parity codes P.

According to a preferred embodiment of the present invention, the longest entry of the markings in the synchronization codes is the identifier ID, which has the length of 14T, and the longest entry of the marking in the disk other than in the synchronization codes is limited to 11T. Here the longest entry marking can be either ON marking or OFF marking.

As shown in FIG. 19, in the non-rewritable disk ND, the recorded codes along the tracks are: synchronization code S1; data (such as video and audio data) and header codes D/H; synchronization code S4; data and parity codes D/P; synchronization code S3; data D; synchronization code S4; data and parity codes D/P; synchronization code S3; data D; . . . synchronization code S2; data and header codes D/H; . . . synchronization code S4; and parity codes P.

According to a preferred embodiment of the present invention, the longest entry of the pits in the synchronization codes is the identifier ID, which has the length of 14T, and the longest entry of the pits in the disk other than in the synchronization codes is limited to 11T. Here the longest entry pits can be either an ON pit portion where the pits are formed or an OFF pit portion which is an interval between the pits.

Embodiment 2

Figure 8:
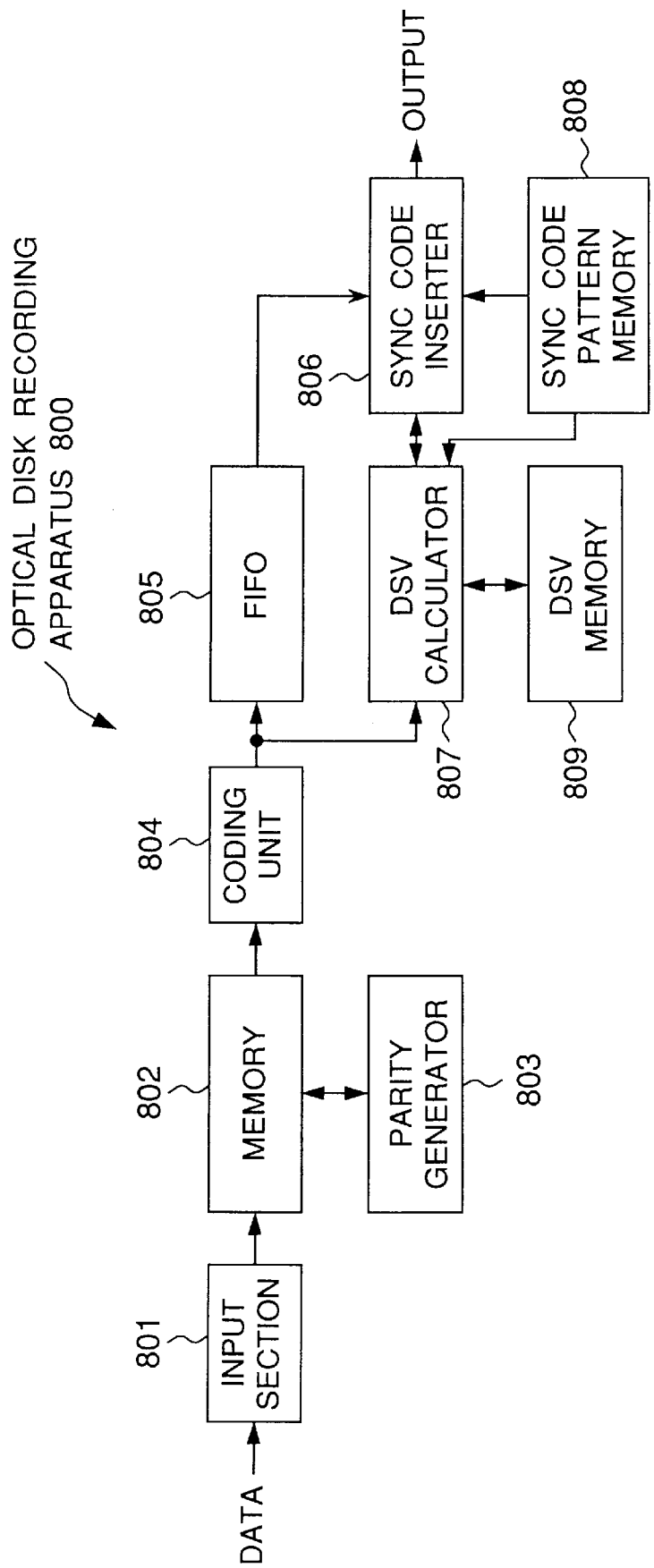
FIG. 8 is a block diagram of an optical disk recording apparatus according to the second embodiment of the present invention.

FIG. 8 is a block diagram of an optical disk recording apparatus 800 described below as the second embodiment of the present invention.

As shown in FIG. 8, this optical disk recording apparatus 800 comprises an input section 801, memory 802, a parity generator 803, coding unit 804, FIFO buffer 805, synchronization code inserter 806, DSV calculator 807, synchronization code pattern memory 808, and DSV memory 809.

The data to be recorded to the optical disk is input through the input section 801, which writes the input data one frame at a time to a particular position (address) in the memory 802.

The memory 802 stores non-synchronization code data formatted with a particular structure as shown in FIG. 1.

The parity generator 803 generates parity data corresponding to the row and column elements of the input data written in the format shown in FIG. 1 to a known address in the memory 802, and writes the generated parity data to a known address in the memory 802.

The coding unit 804 reads the non-synchronization code data written to the memory 802 sequentially from the beginning of the block, converts the read data to code words according to the 8–15 conversion table and conversion rules shown in FIGS. 2 and 3, and then writes the converted code words to the FIFO buffer 805.

The synchronization code inserter 806 counts the code words written to the FIFO buffer 805, and determines for each frame the type of synchronization code to be inserted at the beginning of each frame. After the synchronization code type information to be inserted at the beginning of the frame written to the FIFO buffer 805 is selected by the DSV calculator 807, the synchronization code inserter 806 reads the selected type information and the coding pattern of the fixed part of the synchronization code from the synchronization code pattern memory 808, and then generates the synchronization code by inserting the type information to a predetermined position in the fixed code part of the synchronization code. After outputting the generated synchronization code, the synchronization code inserter 806 reads and outputs the frame following said synchronization code from the FIFO buffer 805. The frame and synchronization code output from the synchronization code inserter 806 is then converted to an NRZI signal, and written to a particular address on the optical disk or other recording medium.

The DSV calculator 807 reads the coding pattern for the fixed part of the synchronization code, and type information 1 and 2 identifying the synchronization code type determined by the synchronization code inserter 806, from the synchronization code pattern memory 808, and generates the code sequences of the synchronization codes to which type information 1 and type information 2 are inserted. It then reads the code sequence input to the FIFO buffer 805 from the beginning of the frame following said synchronization code to the particular DSV comparison point in that frame, and generates the code word sequence for the case in which a synchronization code containing type information 1 is inserted to the beginning of the read code word sequence. A similar code word sequence is also generated for a synchronization code containing type information 2 inserted to the beginning of the read code word sequence.

The DSV calculator 807 then converts the two generated code word sequences to NRZI signals referenced to the signal level of the NRZI signal stored to the DSV memory 809, and calculates the DSV of the NRZI signal corresponding to the two code word sequences from the DSV value stored to the DSV memory 809. The DSV calculator 807 then compares the absolute values of the two DSV calculation results at the end of the code word sequence, i.e., at the DSV comparison point of the frame following the synchronization code, and selects the type information resulting in the DSV calculation result with the smallest absolute value at the DSV comparison point. The DSV calculator 807 then updates the content stored to the DSV memory 809 with the DSV calculation result having the lowest absolute value at the DSV comparison point, and the signal level at the DSV comparison point of the NRZI signal in which the absolute value of the DSV calculation result is lowest. Then, based on the content stored to the updated DSV memory 809, the DSV calculator 807 again calculates the DSV as described above from the DSV comparison point to the end of the frame, and again updates the content of the DSV memory 809 with that calculation result and the NRZI signal level at the end of the frame.

The synchronization code pattern memory 808 stores the code sequence of the fixed part of the synchronization code shown in FIG. 4, and the 5-bit patterns of type information 1 and 2 corresponding to the synchronization code type (S1–S4) shown in FIG. 6. The DSV memory 809 stores the DSV value updated by the DSV calculator 807, and the level of the corresponding NRZI signal.

Figure 9:
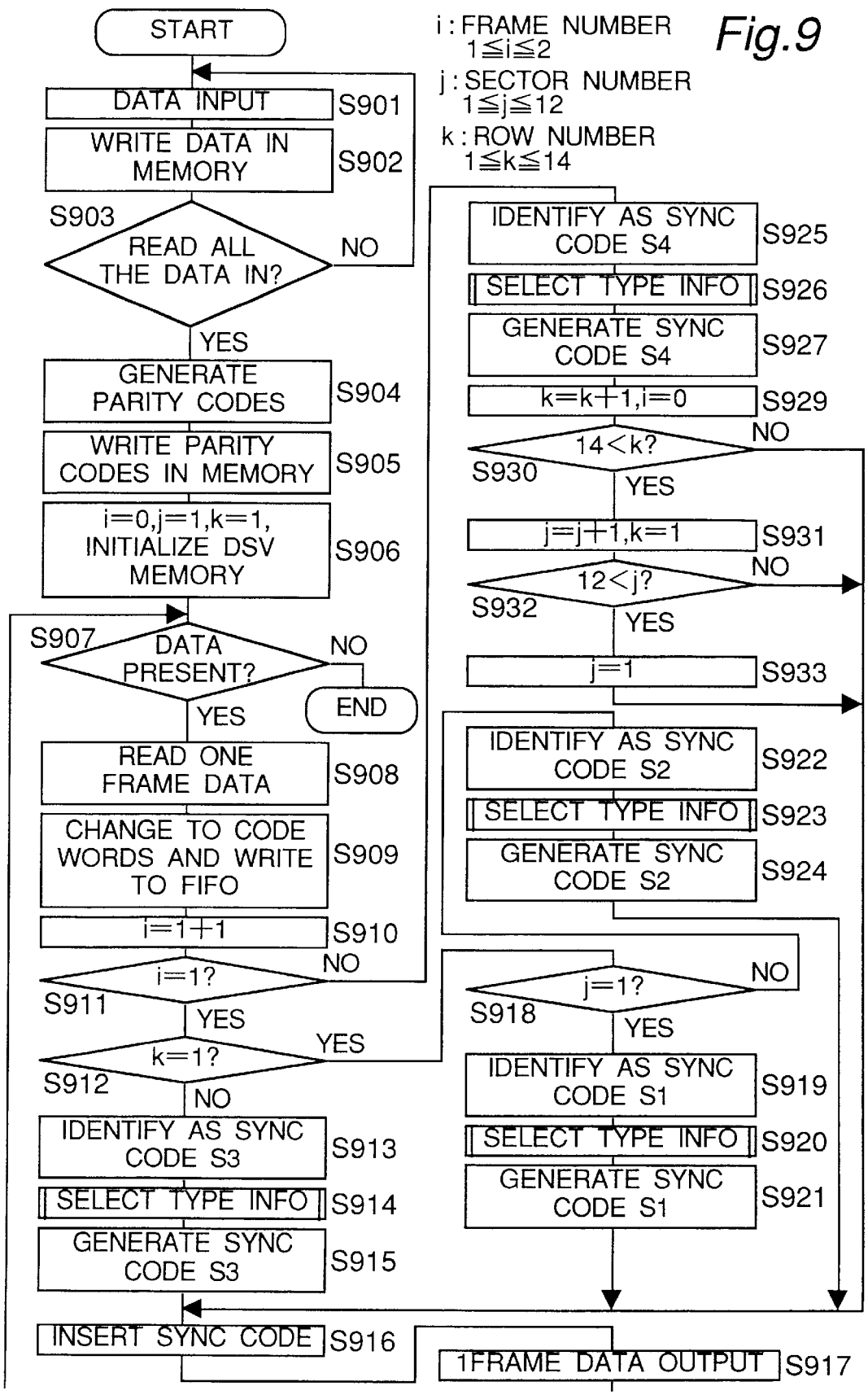
FIG. 9 is a flow chart showing the process executed by the optical disk recording apparatus of the second embodiment.

FIG. 9 is a flow chart of the process executed to record the data containing a synchronization code thus generated in an optical disk recording apparatus according to the present embodiment of the invention.

The data input to the input section 801 (step S901) is sequentially written frame by frame to a known address in the memory 802 (step S902). When all of the data is written to the memory 802 (step S903), parity data is generated for the row and column elements of the data stored to the memory 802 (step S904), and the generated parity data is then written to a known address in the memory 802 (step S905).

The synchronization code inserter 806 initializes each of the parameters used to evaluate the type of the synchronization code to be inserted at the beginning of the data read from the memory 802. The DSV calculator 807 also initializes the content stored to the DSV memory 809.

More specifically, the parameters i, j, and k are initialized to the values i=0, j=1, and k=1, where i is the parameter for tracking whether the frame read from the memory 802 is frame 1 (i=1) or frame 2 (i=2) (the frame count parameter i); k ($1 \leq k \leq 14$) is the parameter for counting the number of rows in each frame (the row count parameter k); and j ($1 \leq j \leq 12$) is the parameter for counting the sector number (the sector count parameter j). The initialization values of the NRZI signal level and the initial DSV value stored to the DSV memory 809 are, for example, LOW and zero (0), respectively (step S906).

If unprocessed data remains in the memory 802 (step S907), the coding unit 804 reads one frame of data from the memory 802 using a known data processing unit (step S908), codes the read data to code word sequences comprising a 15-bit code word for each eight bits of read data using 8–15 conversion, and writes the resulting code word sequence to the FIFO buffer 805 (step S909).

When a code word sequence for one frame of data is written to the FIFO buffer 805, the synchronization code inserter 806 increments the frame counter parameter i (step S910).

If the frame count parameter i=1 (step S911), the row count parameter k=1 (step S912), and the sector count parameter j=1 (step S918), the synchronization code inserter 806 determines that the type of the synchronization code that should be inserted to the beginning of the frame written to the FIFO buffer 805 is synchronization code Si, i.e., the synchronization code indicating the beginning of a data block (step S919).

Using the synchronization code type (synchronization code S1 in this example) determined by the synchronization code inserter 806 inserted to the beginning of frame 1 written to the FIFO buffer 805, the DSV calculator 807 then calculates the DSV value at the DSV comparison point in frame 1 using both type information 1 and type information 2 inserted to the selected synchronization code S1, and selects the type information yielding the DSV value with the lowest absolute value at the DSV comparison point in frame 1 (step S920). Note that the process executed in step S920 is described in greater detail below with reference to FIG. 10.

The synchronization code inserter 806 then generates a synchronization code with the type information selected by the DSV calculator 807 (step S921).

The synchronization code inserter 806 then reads frame 1 from the FIFO buffer 805, inserts the generated synchronization code to the beginning of the frame (step S916), outputs that frame (step S917), and then loops back to step S907.

If in step S911 the frame count parameter i=1 and in step S912 the row count parameter k=1 and the sector count parameter j≠1 in step S918, the synchronization code inserter 806 determines that the type of synchronization code to be inserted to the beginning of the frame written to the FIFO buffer 805 is synchronization code S2, i.e., the synchronization code identifying the beginning of a sector (step S922).

The DSV calculator 807 then selects the type information of synchronization code S2 in step S922 using the same process executed in step S923.

The synchronization code inserter 806 then generates a synchronization code S2 containing the type information selected by the DSV calculator 807 (step S924), and loops back to step S916.

If, however, the sector count parameter k≠1 in step S912, the synchronization code inserter 806 determines that the type of the synchronization code to be inserted to the beginning of the frame written to the FIFO buffer 805 is synchronization code S3, i.e., the synchronization code identifying the beginning of a row other than the first row in the data block or sector (step S913).

The DSV calculator 807 then selects the type information of synchronization code S3 in step S914 using the same process executed in step S920.

The synchronization code inserter 806 then generates a synchronization code S3 containing the type information selected by the DSV calculator 807 (step S915), and loops back to step S916.

If in step S911 the frame count parameter i=2, i.e., i≠1, the synchronization code inserter 806 determines that the type of synchronization code to be inserted to the beginning of the frame written to the FIFO buffer 805 is synchronization code S4, i.e., the synchronization code written to the middle of each row and identifying the beginning of frame 2 (step S925).

The DSV calculator 807 then selects the type information of synchronization code S4 in step S926 using the same process executed in step S914.

The synchronization code inserter 806 then generates a synchronization code S4 containing the type information selected by the DSV calculator 807 (step S927).

The synchronization code inserter 806 then resets the frame count parameter i to 0 (i=0), because the next frame written to the FIFO buffer 805 will be frame 1 in the next row, and increments the sector count parameter k (step S929).

If the value of the row count parameter k is 14<k (step S930), the next frame written to the FIFO buffer 805 will be the first frame in the next sector, and the sector count parameter j is therefore incremented, and the row count parameter k is reset to 1 (step S931). If step S930 returns NO, i.e., if the row count parameter k is not greater than 14, the process skips forward to step S916.

If at step S932 the sector count parameter j is also 12<j as the result of the increment at step S931, the frame next written to the FIFO buffer 805 will be the first frame 1 in the next data block. The sector count parameter j is therefore reset to j=1 (step S933), and the process returns to step S901.

Step S916 loops back to step S907, and if there is no unprocessed data left in the memory 802, the coding unit 804 terminates processing.

Figure 10:
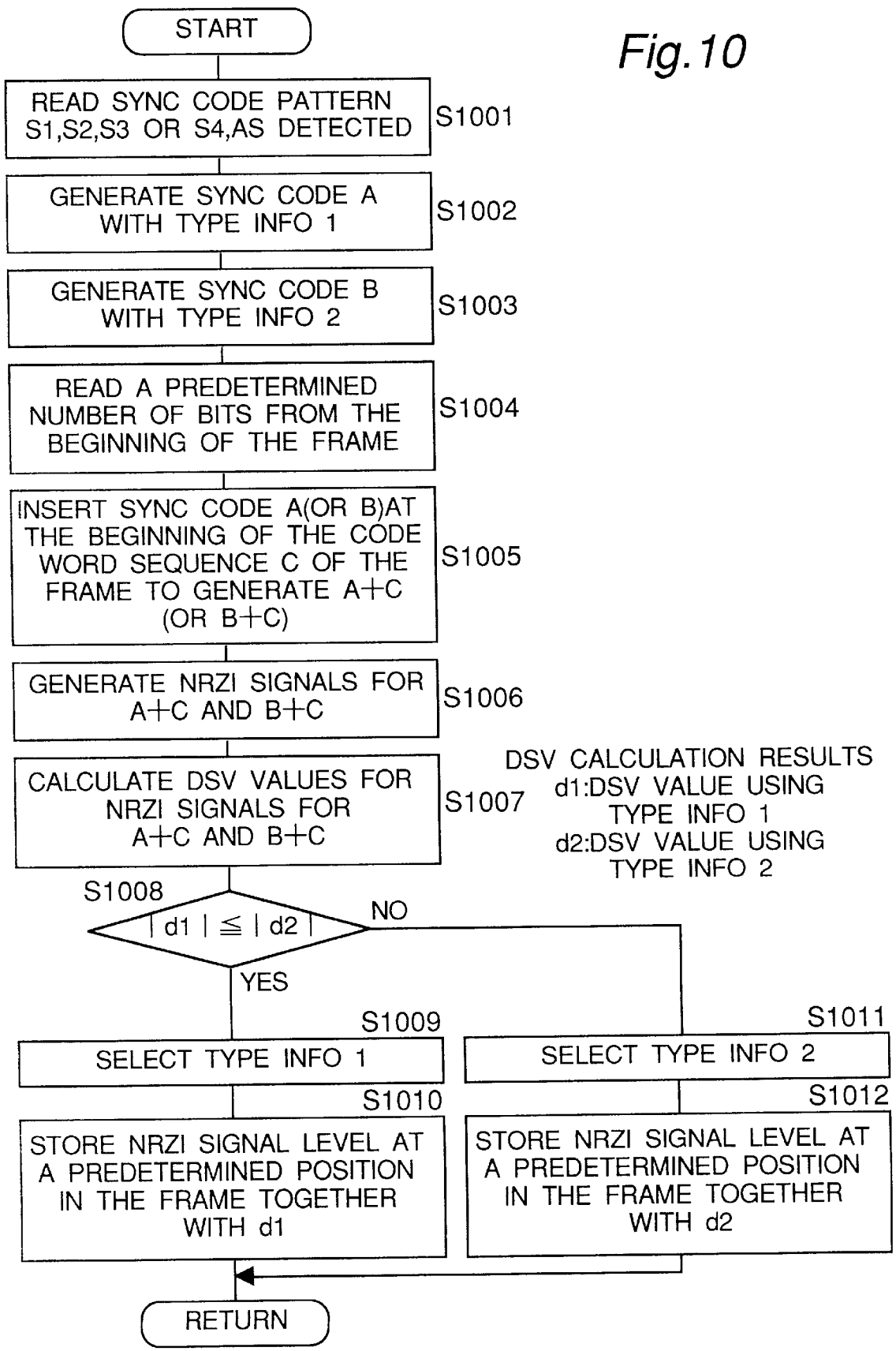
FIG. 10 is a flow chart showing the detail of the type information selection process in steps S914, S920, S923, and S926 in FIG. 9.

FIG. 10 is a flow chart of the type information selection process executed in steps S914, S920, S923, and S926 in FIG. 9.

The DSV calculator 807 reads the 5-bit patterns of type information 1 and 2 indicating the type determined by the synchronization code inserter 806, and the coding pattern of the fixed part of the synchronization code, from the sync code pattern memory 808 (step S1001).

The DSV calculator 807 then generates a code sequence A expressing the synchronization code of a determined type by inserting the read 5-bit pattern for type information 1 to bits 22–26 (the fixed part of the coding pattern) of the simultaneously read synchronization code (step S1002).

The DSV calculator 807 likewise generates a code sequence B expressing the synchronization code of the determined type by inserting the read 5-bit pattern for type information 2 to bits 22–26 (the fixed part of the coding pattern) in the simultaneously read synchronization code (step S1003).

The DSV calculator 807 then reads the code word sequence C from the beginning of the frame stored to the FIFO buffer 805 to a predetermined DSV comparison point (step S1004).

The DSV calculator 807 then generates the two code sequences A+C and B+C by inserting the synchronization code sequences A and B generated in steps S1002 and S1003 to the beginning of the code word sequence C of the frame read from the FIFO buffer 805 (step S1005).

The DSV calculator 807 then generates NRZI signals corresponding to the generated code sequences A+C and B+C based on the NRZI signal level, stored in the DSV memory 809, of the bit immediately before the synchronization code (step S1006).

The DSV calculator 807 then calculates the DSV values for the NRZI signals corresponding to code sequences A+C and B+C based on the DSV values of the bit immediately before the synchronization code as stored in the DSV memory 809 (step S1007).

The DSV calculator 807 then compares the absolute values |d1| and |d2| where d1 is the DSV calculation result at the end of the NRZI signal generated for code sequence A+C containing type information 1, and d2 is the DSV calculation result at the end of the NRZI signal generated for code sequence B+C containing type information 2.

If $|d1| \leq |d2|$ (step S1008), type information 1 is selected (step S1009). The DSV calculator 807 then updates the content of the DSV memory 809 by writing the NRZI signal level at the end of the NRZI signal generated for code sequence A+C containing type information 1, and DSV calculation result d1, to the DSV memory 809, and terminates the type information selection process (step S1010).

However, if $|d1| > |d|$, i.e., step S1008 returns NO, the DSV calculator 807 selects type information 2 (step S1011). The DSV calculator 807 then updates the content of the DSV memory 809 by writing the NRZI signal level at the end of the NRZI signal generated for code sequence B+C containing type information 2, and DSV calculation result d2, to the DSV memory 809, and terminates the type information selection process (step S1012).

It is therefore possible by means of the present embodiment to achieve an optical disk recording apparatus 800, and a recording method therefor, for recording to an optical disk or other recording medium data containing a synchronization code that can be accurately and reliably discriminated from the non-synchronization code data, and having various functions.

It should be noted that the recording medium referenced above may be thought of as a transmission path for transmitting said data and synchronization code sequence recorded by said recording apparatus to the reproduction apparatus. An alternative embodiment of the present invention therefore provides a transmission method for transmitting to a transmission path data containing a synchronization code that can be accurately and reliably discriminated from the non-synchronization code data, and having various functions, as described in the first embodiment above.

Embodiment 3

Figure 11:
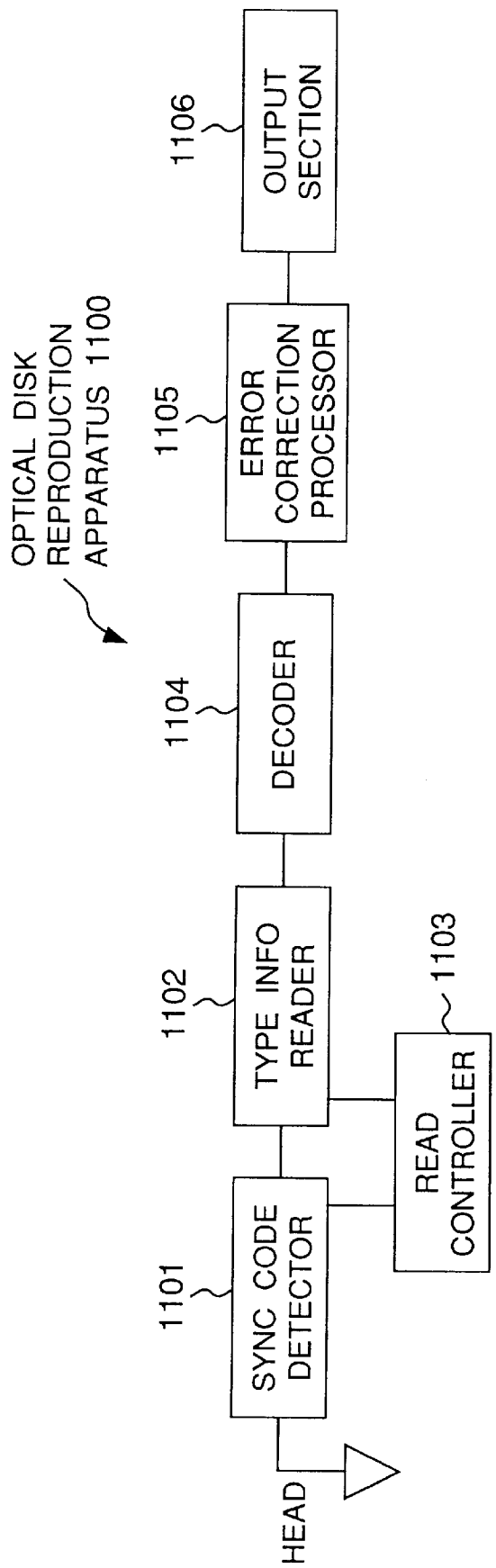
FIG. 11 is a block diagram of an optical disk reproduction apparatus according to a third embodiment of the present invention.

FIG. 11 is a block diagram of an optical disk reproduction apparatus 1100 according to a third embodiment of the present invention. As shown in FIG. 11, this optical disk reproduction apparatus 1100 comprises a synchronization code detector 1101, a type information reader 1102, a read controller 1103, a decoder 1104, an error correction processor 1105, and an output section 1106.

The synchronization code detector 1101 obtains the data containing a synchronization code as described above from the optical disk to which it is recorded as the reproduction signal, digitizes said reproduction signal, converts the digitized signal to an NRZI signal, demodulates said NRZI signal to a code word sequence (parallel data) comprising 15-bit code words, and outputs to the type information reader 1102. The synchronization code detector 1101 also identifies any signal segment in the demodulated NRZI signal in which the inversion interval is 16T or greater as the synchronization code identifier, and outputs a synchronization code detection signal to the type information reader 1102. When an NRZI signal segment with a 16T or greater inversion interval is discriminated, the synchronization code detector 1101 also outputs a set signal to the read controller 1103.

The type information reader 1102 is, in practice, identical to the decoder 1104, but reads as the data to be processed the code word supplied from the synchronization code detector 1101 immediately after the synchronization code identifier is discriminated, i.e., the code word containing the synchronization code type information immediately following the synchronization code detection signal output. The read type information is output to the read controller 1103.

The read controller 1103 detects and corrects read clock phase error at each inversion of the NRZI signal, and synchronizes the first bit of the code word output from the synchronization code detector 1101 to the type information reader 1102 each time the synchronization code detector 1101 identifies the synchronization code identifier (i.e., the NRZI signal segment where inversion interval TS=16T), i.e., at the set signal timing. The read controller 1103 then reads the content of the data decoded by the decoder 1104 to control the reproduction operation executed by the components of the optical disk reproduction apparatus 1100.

The decoder 1104 reverses the 8–15 conversion process using a data processing unit comprising a predetermined quantity of the 15-bit code words supplied from the synchronization code detector 1101, and writes the result to a known address in a memory (which is not shown).

The error correction processor 1105 then reads the parity data from the converted data written to said known address in memory (which is not shown), and applies error correction processing to each data block. The data stored to memory is then updated using the error corrected data.

The output section 1106 then sequentially reads and outputs the error-corrected data from the memory not shown.

Figure 12:
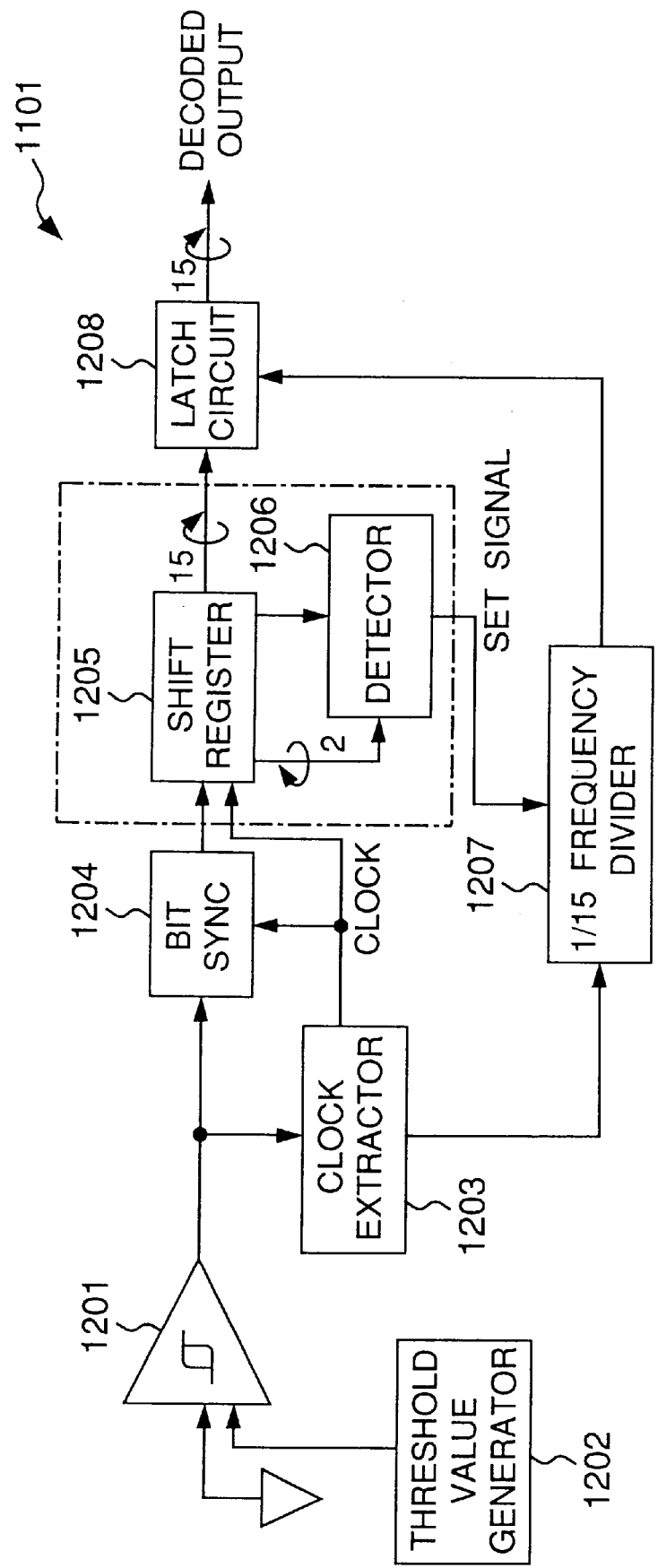
FIG. 12 is a block diagram showing the detail of the synchronization code detector and read controller shown in FIG. 11.

FIG. 12 is a block diagram showing a specific hardware configuration of the synchronization code detector 1101 and read controller 1103 shown in FIG. 11.

The synchronization code detector 1101 and read controller 1103 comprise a comparator 1201, threshold level generator 1202, clock extractor 1203, bit synchronizer 1204, shift register 1205, detector 1206, $1/15^{th}$ frequency divider 1207, and latch circuit 1208.

The comparator 1201 compares the reproduction signal reproduced from the optical disk with the read threshold level input from the threshold level generator 1202, and digitizes the input reproduction signal by converting signal values in the reproduction signal equal to or exceeding the read threshold level to HIGH bits, and signal levels below the read threshold level to LOW bits.

The threshold level generator 1202 generates the read threshold level used by the comparator 1201.

The clock extractor 1203 is a phase-lock loop (PLL) for generating the read clock from the output signal of the comparator 1201, and synchronizing the period and phase of the read clock so that the output of the comparator 1201 inverts at the reference position, which is the midpoint of the PLL-generated read clock.

The bit synchronizer 1204 samples the comparator output at the timing of the read clock from the clock extractor 1203, converts the reproduction signal to an NRZI signal, and then demodulates the resulting NRZI signal to an NRZ (non-return to zero) signal.

The shift register 1205 sequentially inputs the NRZ signal expressing the code word as serial data at the read clock timing from the clock extractor 1203, converts 18 bits of the NRZ signal to parallel data, and outputs the result to the detector 1206. Fifteen consecutive bits in the shift register output are also output to the latch circuit 1208.

When a code sequence corresponding to the 16T inversion interval of the NRZI signal, i.e., the code sequence (10000000000000001) containing a fifteen bit run of zeroes (0), or a code sequence corresponding to the 17T inversion interval of the NRZI signal, i.e., the code sequence (100000000000000001) containing a sixteen bit run of zeroes (0), is input, the detector 1206 outputs the synchronization code detection signal indicating that the synchronization code identifier was identified to the type information reader 1102 (not shown in FIG. 12). When the code sequence (100000000000000001) corresponding to the 16T inversion interval of the NRZI signal is input, a set signal is also output to the 1/15$^{th}$ frequency divider 1207.

The 1/15$^{th}$ frequency divider 1207 generates the word clock by 1/15$^{th}$ frequency dividing the read clock. The 1/15$^{th}$ frequency divider 1207 also synchronizes the word clock phase so that the word clock rise (or fall) is output before the third read clock from the set signal output, i.e., at the twelfth read clock from the set signal.

The latch circuit 1208 holds the 15-bit parallel data from the shift register 1205 at the word clock timing from the 1/15$^{th}$ frequency divider 1207, and outputs to the decoder 1104.

Figure 13:
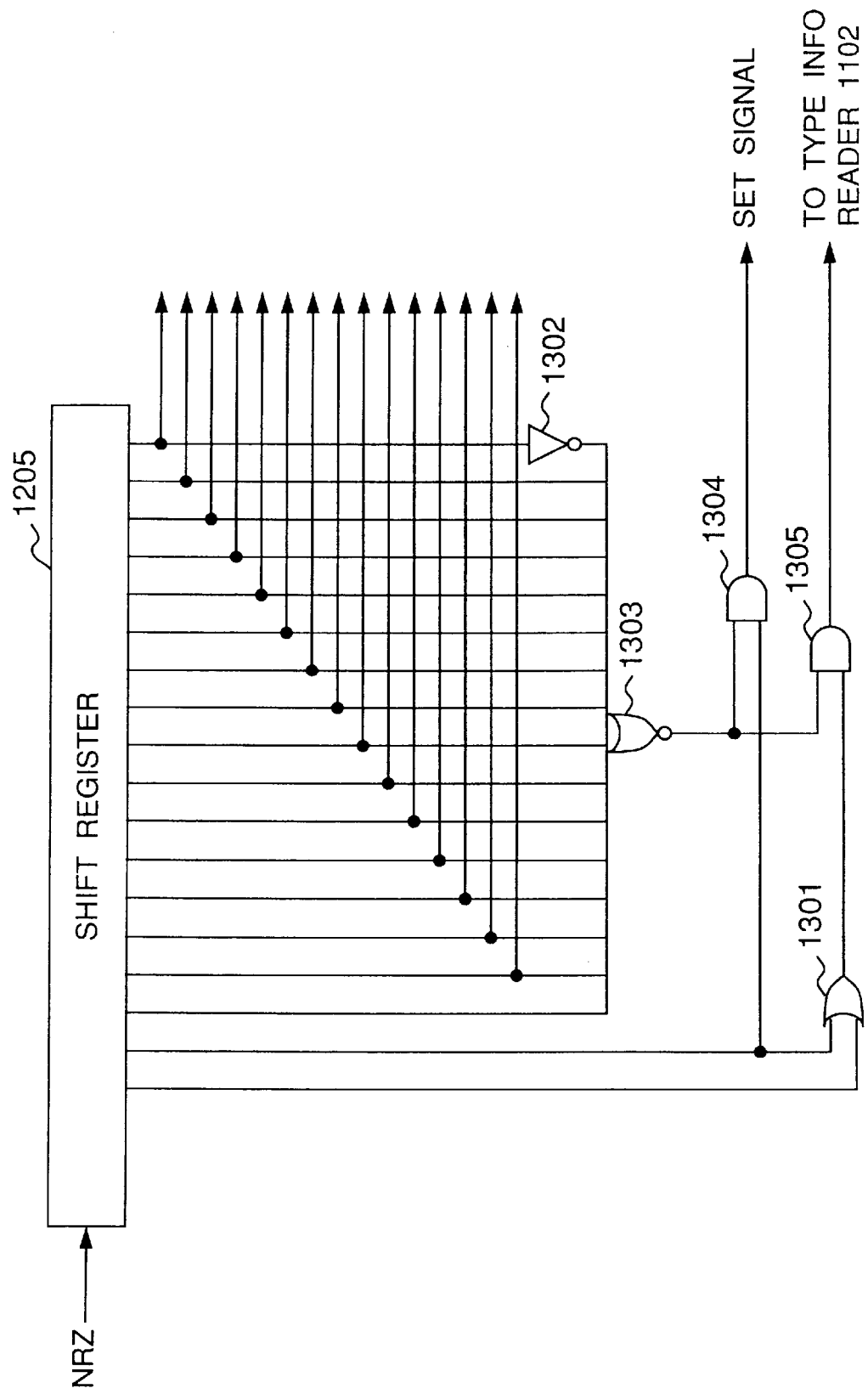
FIG. 13 is a block diagram of the shift register and detector shown in FIG. 12.

FIG. 13 is a block diagram of the hardware configuration of the shift register 1205 and detector 1206 shown in FIG. 12. Note that in FIG. 13 the high bit of the code sequence output from the shift register 1205 is shown on the right, and the low bit is on the left. In addition, the n$^{th}$ bit counted from the highest bit (most significant bit) in the output of the shift register 1205 is referenced as simply bit n below.

The detector 1206 comprises an OR gate 1301, an inverter 1302, a NOR gate 1303, and AND gates 1304 and 1305.

Bits 17 and 18 of the parallel data output from the shift register 1205 are input to the OR gate 1301, which outputs 1 when either of the inputs is 1.

Bit 1 of the parallel data output from the shift register 1205 is input to the inverter 1302, which inverts the bit and outputs the inverted bit.

Bits 1 through 16 of the parallel data output from the shift register 1205 are input to the NOR gate 1303, with bit 1 input through the inverter 1302. If all input bits are 0, the NOR gate 1303 outputs 1.

The output from the NOR gate 1303, and bit 17 of the parallel data output from the shift register 1205, are input to the one AND gate 1304, which outputs 1 if both of the inputs are 1.

The outputs from the NOR gate 1303 and the OR gate 1301 are input to the other AND gate 1305, which also outputs 1 if both of the inputs are 1.

The overall operation of the process executed by the detector 1206 thus comprised is described in greater detail below.

As shown in FIG. 13, bit 1 of the shift register output is input through the inverter 1302, while bits 2–16 are input directly, to the NOR gate 1303. As a result, the NOR gate 1303 outputs 1 when bit 1 in the shift register 1205 is 1 and bits 2–16 are all 0. The output from the NOR gate 1303 and bit 17 from the shift register 1205 are input to the AND gate 1304. As a result, the AND gate 1304 outputs 1 only when bits 1 and 17 of the shift register output are is, and all bits 2–16 are 0s.

This bit sequence corresponds to the code sequence for the synchronization code identifier expressed by an inversion interval TS=16T in the NRZI signal. An output of 1 from the AND gate 1304 indicates that the synchronization code and other data were correctly read, and is used as the set signal for synchronizing the phase of the 1/15$^{th}$ frequency divider 1207. As a result, a 1 is not output as the set signal when TS=17T due to a ΔT shift in the NRZI signal inversion interval TS caused by noise or other factor.

Bits 17 and 18 in the shift register output are input to the OR gate 1301. The outputs from the NOR gate 1303 and OR gate 1301 are input to the AND gate 1305. The AND gate 1305 thus outputs 1 if bit 1 is 1, bits 2–16 are all 0, and either bit 17 or 18 is 1 in the shift register output. Thus, a 1 is output as the synchronization code detection signal even when TS=17T due to a ΔT shift in the NRZI signal inversion interval TS caused by noise or other factor. In addition, an output of 1 from the AND gate 1305 indicates that even if a slight read error occurs when reading the data containing the synchronization code, the synchronization code was correctly discriminated from the other data, and the read error that occurred is within the correction capacity of the error correction processor. The output from the AND gate 1305 is therefore output to the type information reader 1102 as the synchronization code detection signal.

The synchronization code identifier can thus be detected even when TS=17T due to a ±T shift in the NRZI signal inversion interval TS caused by noise or other factor, and the synchronization code type information can be read. Furthermore, because it is not possible to detect whether the shift in the inversion position occurred at the rise or fall of the NRZI signal corresponding to the synchronization code identifier when the NRZI signal inversion interval TS=17T, the synchronization code of which the identifier has an inversion interval TS of 17T in the NRZI signal is not suited for use detecting the first bit in the code word. It is therefore possible to accurately read the code words of the data in the code word sequence by detecting the first code word bit using only the identifier of a synchronization code in which read error did not occur.

Figure 14:
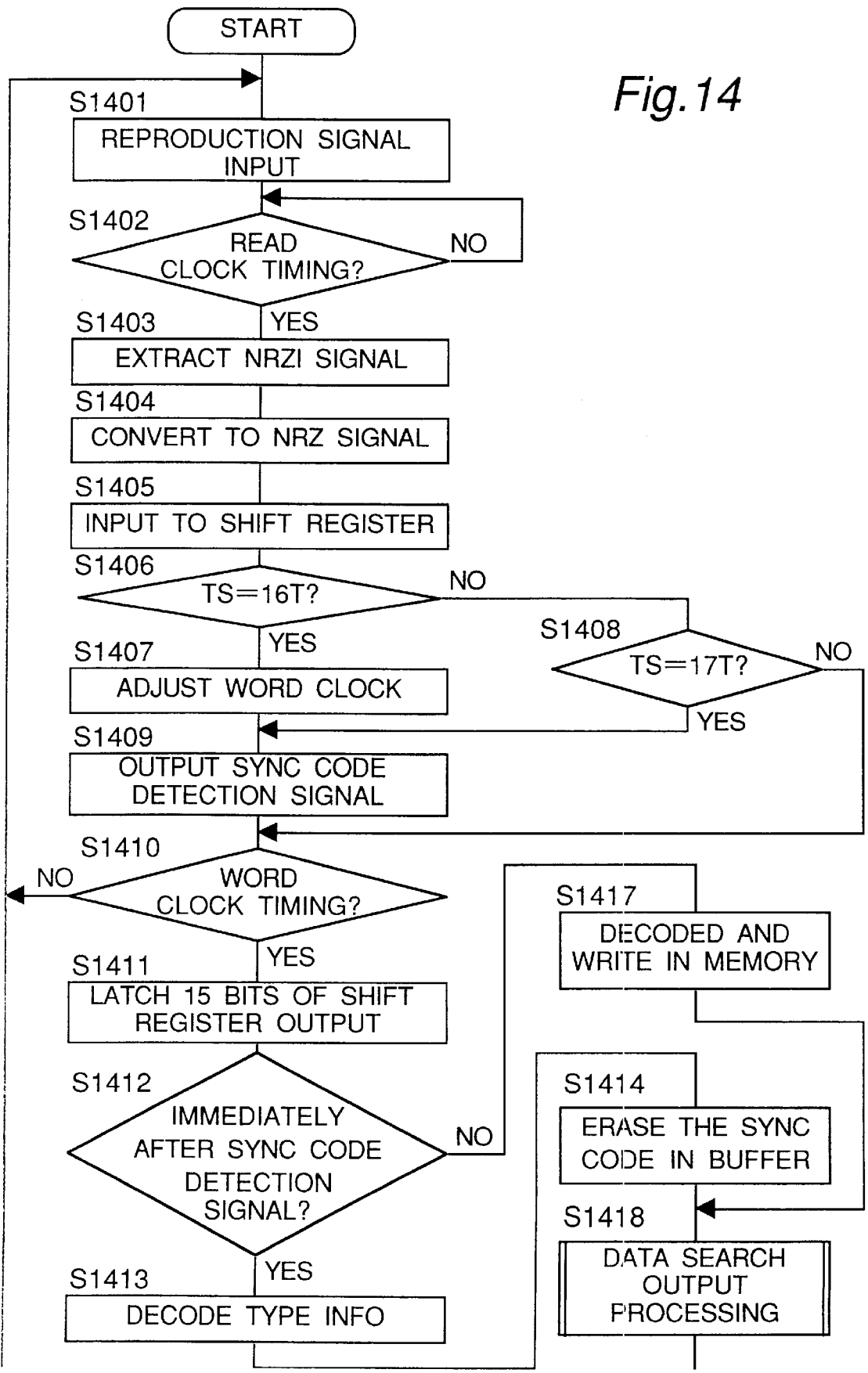
FIG. 14 is a flow chart showing the data reproduction process executed by the optical disk reproduction apparatus according to the third embodiment of the present invention.

The reproduction process executed by the optical disk reproduction apparatus 1100 according to the present embodiment of the invention is described in greater detail below with reference to the flow chart thereof in FIG. 14.

The process starts when the reproduction signal of the data and synchronization code recorded to the optical disk as described above are reproduced by the reproduction head of the optical disk reproduction apparatus 1100, and input to the synchronization code detector 1101 (step S1401).

The bit synchronizer 1204 of the synchronization code detector 1101 samples the output from the comparator 1201 at the read clock timing (step S1402), extracts an NRZI signal from the reproduction signal (step S1403), converts the NRZI signal to an NRZ signal (step S1404), and outputs to the shift register 1205 (step S1405).

The detector 1206 of the synchronization code detector 1101 constantly monitors each bit in rolling sequences of 18 consecutive bits in the output from the shift register 1205 to detect the code sequence in the NRZI signal in which the inversion interval TS=16T, i.e., to detect the NRZI signal segment corresponding to the synchronization code identifier by detecting the code sequence containing a 15 bit run of zeroes (0). When the code sequence corresponding to the NRZI signal inversion interval TS=16T is detected (step S1406), the detector 1206 outputs the set signal to the 1/15$^{th}$ frequency divider 1207. The 1/15$^{th}$ frequency divider 1207 then adjusts the word clock rise (or fall) timing based on the set signal (step S1407).

When a code sequence corresponding to the NRZI signal inversion interval TS=16T is not detected in step S1406, the detector 1206 looks for a code sequence corresponding to a NRZI signal inversion interval TS=17T, i.e., detects a code sequence with a 16 bit run of zeroes (0) (step S1408). When this TS=17T code sequence is detected, the synchronization code detection signal is output to the type information reader 1102 (step S1409). When a code sequence corresponding to the NRZI signal inversion interval TS=17T is not detected in step S1408, the process skips forward to step S1410.

The latch circuit 1208 detects the word clock rise (or fall) as a latch enable signal (step S1410), and latches the fifteen bits output from the shift register 1205 at the latch enable timing (step S1411). When a latch enable is not detected in step S1410, the process loops back to the beginning (step S1401).

If a latch enable is detected, the type information reader 1102 determines whether the latch enable detected in step S1410 was detected immediately following the synchronization code detection signal (step S1412). If it was, the latched fifteen bits, i.e., the code word segment of the synchronization code, is decoded and the type information read, and the result is output to the read controller 1103 (step S1413). Next, the first fifteen bits of the synchronization code written to a buffer (not shown) in the decoder 1104 are erased (step S1414), and the process steps to step S1418.

If in step S1412 the latch enable detected in step S1410 is determined to have not occurred immediately following the synchronization code detection signal, the type information reader 1102 transfers the latched fifteen bits to the decoder 1104.

The decoder 1104 decodes each 15-bit code word of the code sequence in the buffer to 8-bit digital data, and thereafter the control passes to step S1418.

The read controller 1103 instructs the decoder 1104 to decode, for example, only the synchronization code identifier, the block number written immediately following the synchronization code S1, and the sector address written immediately following the synchronization code S2, to search for the desired data (step S1418). When, for example, data reading begins from some midpoint in the sector to which the desired data is written, the read controller 1103 stores the address at which reading began, loops back to step S1401, and repeats from step S1401 to S1417 to write the desired data from the accessed address (the stored address) to the end to memory. After writing the desired data from the accessed address to the end to memory, the read controller 1103 again searches for the first block of the desired data, and again repeats from step S1401 to S1417 to write the remaining data from the beginning of the data block to the stored address to memory. Note that this data is inserted before the data previously stored to memory, resulting in the normal code sequence from beginning to end. Error correction processing is also applied by the error correction processor 1105 one block at a time to the data written to memory. When error correction processing of the first block of desired data is completed, the error-corrected data is sequentially read from memory and output.

It is therefore possible by means of the present embodiment to achieve a method for reading from the recording medium data containing a synchronization code that can be accurately and reliably discriminated from the non-synchronization code data, and having various functions. It is therefore possible by means of this reading method to search and accurately read data recorded to an optical disk or other recording medium at high speed, to correct read errors that may occur with a high error correction capability, and output accurate data.

Said recording medium may also be thought of as a transmission path for transmitting to a reproduction apparatus the data and synchronization code recorded by the recording apparatus according to the present invention. It is therefore possible by means of the present embodiment to achieve a reading method for reading from a transmission path data containing a synchronization code that can be accurately and reliably discriminated from the non-synchronization code data, and having various functions, as described in the first embodiment above according to the present invention.

Embodiment 4

A synchronization code according to the fourth embodiment of the invention described below achieves high reliability recognition of non-synchronization code data while using a short signal length as in the preceding embodiments of the invention, while also achieving resistance to variations in the threshold level of the wave shaping operation extracting a digitized NRZI signal from the analog reproduction signal comparable to that achieved with conventional synchronization codes.

Note that the data cum synchronization code according to the present embodiment is modulated using 8–16 conversion based on 8–14 conversion table like conventional EFM. Specifically, the data cum synchronization code before modulation is converted to code words comprising a 14-bit code sequence for each 8-bit data byte. The number of consecutive zeroes (0) bracketed by ones (1) in each code word is a minimum of two (2) and a maximum of ten (10). When the 8–16 modulated code word sequence is then modulated to an NRZI signal, the maximum inversion interval $T_{max}$ of the NRZI signal is $T_{max}$=11T, and the minimum inversion interval $T_{min}$ is $T_{min}$=3T. In addition, the bits at the junction between code words are either 00, 01, or 10 so that the number of consecutive zeroes at the junction between code words is two or more and ten or less.

The modulated data and synchronization code is then modulated to an NRZI signal, and stored to an optical disk as the recording medium of the present invention. Note that while the 8–16 code words express one data byte with fourteen bits, two bits, e.g., 00, are inserted between the code words. These two bits are therefore included in each code word below, and the 8–16 modulated code word sequence therefore effectively expresses each data byte with sixteen bits.

By thus selecting the conjunction bits, the maximum inversion interval $T_{max}$=11T and minimum inversion interval $T_{min}$=3T conditions of the NRZI signal described above are satisfied in the code word conjunctions. As a result, if an NRZI signal with an inversion interval less than minimum inversion interval $T_{min}$=3T is detected after the reproduction signal from the recording medium is wave shaped and the NRZI signal extracted, the reproduction apparatus immediately recognizes a read error and can take appropriate action.

Figure 15:
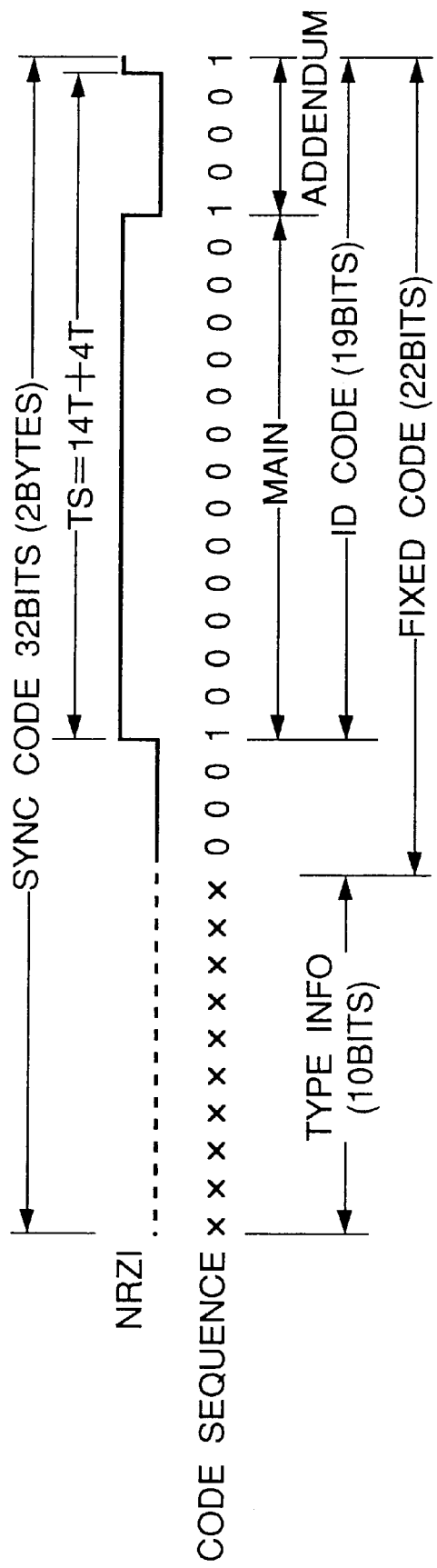
FIG. 15 is a diagram showing the data structure of the synchronization code according to the fourth embodiment of the invention.

FIG. 15 is used to describe the data structure of the synchronization code in this embodiment of the invention. Note that in FIG. 15 "x" represents bits with a code value of either zero (0) or one (1).

The synchronization code in this embodiment also has a data length of two bytes, expressed by a 32-bit code sequence. Each synchronization code comprises type information identifying the location in the data block to which the synchronization code is inserted, and an identifier for discriminating the synchronization code from other data.

The type information is expressed by the highest ten bits from the beginning of the synchronization code. As in the embodiments described above, two different code sequences expressing the same address information are available for selection as the type information. When the data and synchronization code according to the present invention are recorded to the recording medium, the type information code sequence achieving the smallest absolute DSV value is selected according to the DSV value calculated for the code sequence containing the synchronization code. Note that because the type information of the synchronization code according to this embodiment is ten bits long, the type information can be used to express significantly more information than in the preceding embodiments. However, what type of address information is further expressed by the type information is not essential to the present invention, and further discussion thereof is therefore omitted below.

The low 22 bits of the synchronization code following the type information are a fixed code sequence common to every synchronization code.

The lowest 19 bits of this fixed code sequence form the synchronization code identifier. The code sequence pattern of the identifier, and the inversion pattern of the corresponding NRZI signal, are both patterns that do not appear in the code words expressing the "non-synchronization code data" or in the code word conjunctions. In the 19-bit code sequence of the identifier, only bits 1, 15, and 19 will have a value of 1 while all other bits have a value of 0. When the identifier comprising this 19-bit code sequence is modulated to an NRZI signal, the identifier is expressed by a main sequence and an addendum. The main sequence is a HIGH or LOW level bit sequence of a period 14T (=$T_{max}$+3T), after which the bit level inverts and the addendum continues as a LOW or HIGH level bit sequence of a period 4T (=$T_{min}$+1T). The length of the addendum can be $T_{min}$+mT, wherein m is an integer equal to or greater than 0, and is preferably 1. Thus, the wave form of the NRZI signal corresponding to the identifier inverts only once at bit 15 of the identifier code sequence.

Figure 20:
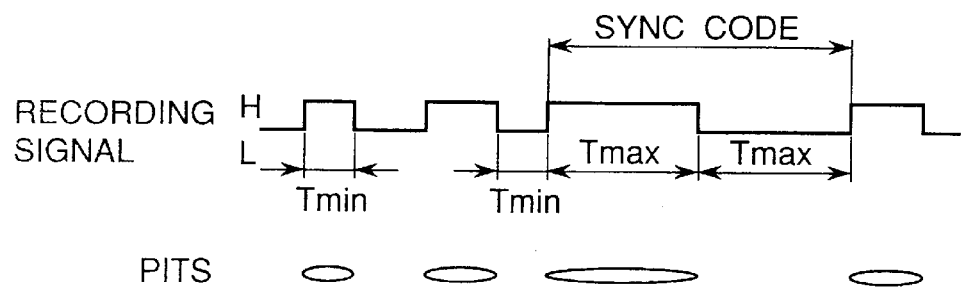
FIG. 20 is a diagram showing the pits and signal wave recorded to a conventional optical disk for data containing a synchronization code according to the prior art.
Figure 21:
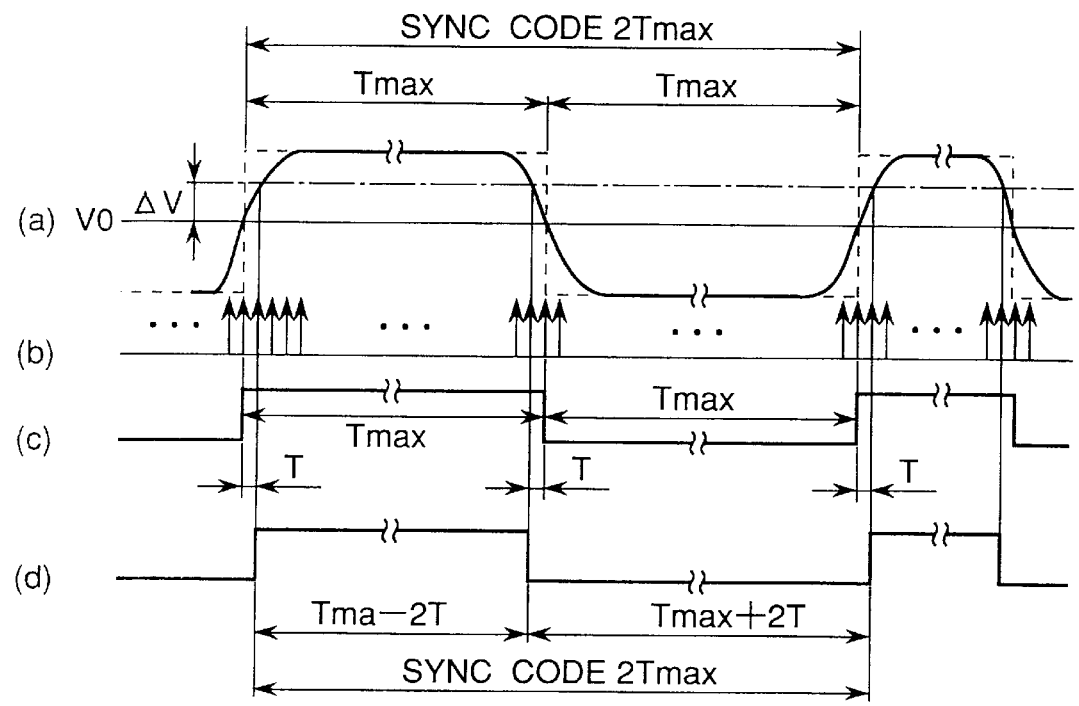
FIG. 21 is a diagram showing the relationship between the reproduction signal for the data containing a synchronization code and reproduced from the recorded content of a conventional optical disk, and the NRZI signal read from the reproduction signal according to the prior art.

By thus adding an addendum whereat the NRZI signal level inverts from the main sequence of the identifier as shown in the identifier of the present embodiment in FIG. 15, the present embodiment achieves, in addition to the effects obtained by the preceding embodiments, the same effects achieved by the conventional synchronization code described above with reference to FIGS. 20 and 21. In other words, when an error occurs in the NRZI signal inversion interval as a result of fluctuations in the threshold value used for wave shaping the reproduction signal, an inversion interval longer than the maximum inversion interval $T_{max}$ of the NRZI signal segment expressing the non-synchronization code data will only appear in the part of the NRZI signal containing the synchronization code in the code sequence corresponding to the main sequence of the identifier. In addition, the total inversion interval TS of the identifier, including the inversion interval of the addendum following the main sequence, is controlled to precisely TS=18T so that error occurring in the inversion interval of the HIGH level side of the NRZI signal, and error occurring in the inversion interval of the LOW level side, cancel each other.

It should be noted that code sequences in which the sum of the lengths of two consecutive inversion intervals in the NRZI signal is 18T or greater may also appear in the non-synchronization code data. However, code sequences in which both the sum of the lengths of two consecutive inversion intervals in the NRZI signal is 18T or greater, and the inversion interval of the first code sequence is ($T_{max}$+3T), do not occur in the non-synchronization code data. More specifically, the maximum inversion interval $T_{max}$ occurring in the non-synchronization code data, and therefore the inversion interval in the first part of any two inversion intervals with a combined length TS of 18T, will be 11T or less. As a result, even if two consecutive inversion intervals with a combined length of 18T or less occur in the non-synchronization code data of the NRZI signal, these will not be confused with the identifier of the synchronization code. At startup, the reproduction apparatus can therefore reference the 18T signal length TS of the identifier to appropriately adjust the frequency of the read clock or the drive (rotational) speed of the optical disk or other recording medium. More specifically, the reproduction apparatus adjusts the frequency of the read clock or the drive (rotational) speed of the optical disk or other recording medium so that the signal length of the identifier actually read matches the length of 18 bits in the 8–16 modulated code sequence.

The signal length of the synchronization code identifier should also be as short as possible because it only contains information identifying the synchronization code. The run of zeroes (0) in the addendum should therefore also be as short as possible. By setting the run of 0 in the addendum to two bits, i.e., the shortest run of zeroes in the 8–16 modulated code sequence, it is therefore possible to both achieve the beneficial effects of the conventional synchronization code and a synchronization code identifier with the shortest possible signal length.

The amplitude of the reproduction signal corresponding to an addendum of 00, i.e., the shortest possible run of zeroes, is low, however, resulting in easy shifting of the inversion position on both sides of the corresponding NRZI signal. In particular, when the inversion position at the end of the addendum shifts, the overall signal length TS of the synchronization code identifier fluctuates, creating problems when adjusting the clock frequency during reproduction apparatus startup.

The present embodiment therefore defines the zero run length of the addendum of the synchronization code identifier to three bits, and can tolerate a shift of ±1 bit in the position of the inversion bit separating the main sequence and addendum in the synchronization code identifier. Note that when the 1 normally occurring at bit 15 in the synchronization code identifier shifts to bit 14 or bit 16, the resulting identifier code pattern still does not occur in either the non-synchronization code data or the code sequence conjunctions.

Data containing the synchronization code according to the present embodiment can be recorded to an optical disk or other recording medium by means of the optical disk recording apparatus 800 shown in FIG. 8 and the recording process described above. What differs is that the synchronization code pattern memory 808 does not store the pattern shown in FIG. 4, but instead stores the fixed code sequence of the synchronization code shown in FIG. 15, and the code sequences expressing the 10-bit type information described above. As with the synchronization codes S1–S4 shown in FIG. 6, the type information used in this embodiment comprises two code patterns of type information 1 and 2 with type information 1 or 2 selected based on the DSV value calculated in a specific range including the synchronization code.

It should be further noted that while the recording medium to which the data containing a synchronization code according to the present invention is recorded by the optical disk recording apparatus 800 has been described as an optical disk, the recording process executed by the optical disk recording apparatus 800 can also be used to record data containing said synchronization code to recording media other than optical disks.

The data containing a synchronization code according to the present invention can also be reproduced from an optical disk recording medium by means of the reproduction process executed by the optical disk reproduction apparatus 1100 shown in FIG. 11. In this case, however, the structure of the synchronization code detector 1101 shown in FIG. 12 will differ in the optical disk reproduction apparatus for reproducing data containing a synchronization code according to the present invention. The differences between the synchronization code detector of the optical disk reproduction apparatus of the present embodiment, and the synchronization code detector 1101 shown in FIG. 12 are described below with reference to FIGS. 12 and 16. Note that components of the synchronization code detector shown in FIG. 16 corresponding to like components in FIG. 12 are referenced below by simply adding a prime mark to the FIG. 12 reference. The structure and discrimination process executed by the shift register 1205' and detector 1206' are also described in detail referring to FIG. 16.

The $1/16^{th}$ frequency divider 1207' of this embodiment may be achieved using a programmable divider, as may the $1/15^{th}$ frequency divider 1207 in FIG. 12, but frequency divides the clock from the clock extractor 1203 to $1/16$ rather than $1/15$, and outputs the resulting word clock to the latch circuit 1208'.

The latch circuit 1208' accordingly latches the 16-bit code word output from the shift register 1205' at the word clock timing.

Figure 16:
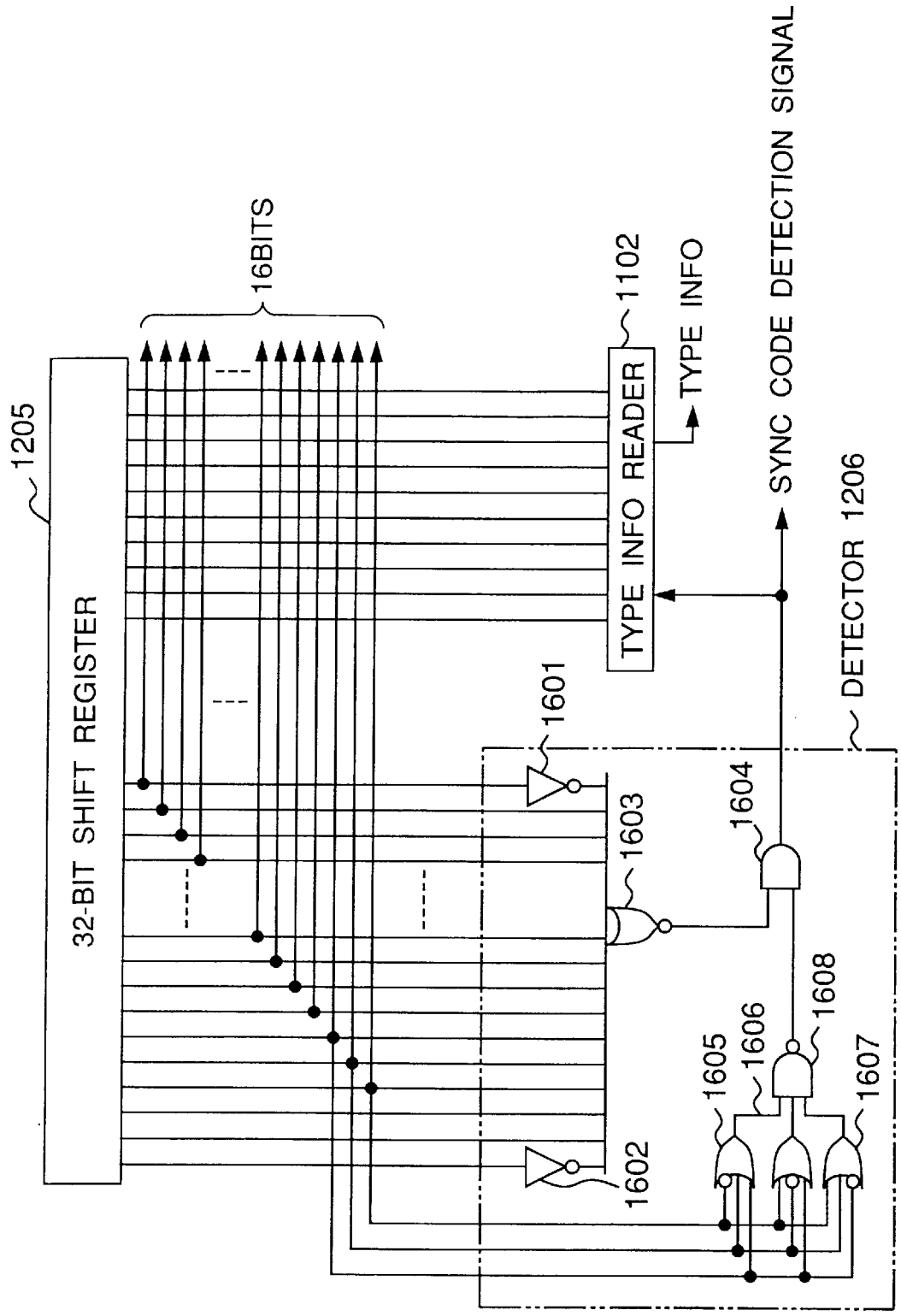
FIG. 16 is a block diagram showing a modification of the shift register and detector shown in FIG. 13.

FIG. 16 is a block diagram showing the detailed configuration of the shift register 1205' and detector 1206'. Note that as seen in FIG. 16 the high bit of the code sequence output from the shift register 1205' is shown on the right, and the low bit on the left. In addition, the $n^{th}$ bit counted from the highest bit in the output of the shift register 1205' is referenced as simply bit n below.

The shift register 1205' outputs a 32-bit parallel data sequence. The high ten bits of the output from the shift register 1205' are output to the type information reader 1102. The type information reader 1102 reads the high ten bits in the shift register output when the value of the synchronization code detection signal from the detector 1206' is 1. The low sixteen bits of the output from the shift register 1205' are output to the latch circuit 1208', and the low nineteen bits are output to the detector 1206'. Note that bits 11, 12, and 13 of the shift register output are not used.

The detector 1206' comprises a first inverter 1601, a second inverter 1602, a NOR gate 1603, AND gate 1604, OR gates 1605, 1606, and 1607, and NAND gate 1608.

The first inverter 1601 inverts bit 14 in the output from the shift register 1205'.

The second inverter 1602 inverts the lowest bit, i.e., bit 32, in the output from the shift register 1205'.

The thirteen bits from bit 14 to bit 26, and the lowest three bits of the output from the shift register 1205', are input to the NOR gate 1603. Note that as above bit 14 is input thereto through the first inverter 1601, and the lowest bit (bit 32) is input thereto through the second inverter 1602. If all input bits are zero, the NOR gate 1603 outputs 1.

The outputs from the NOR gate 1603 and NAND gate 1608 are input to the AND gate 1604, which outputs a 1 as the synchronization code detection signal if both inputs are 1.

The three bits from bit 27 to bit 29 of the output from the shift register 1205' are input to the OR gate 1605 with only bit 29 inverted before being input. If all three input bits are zero, i.e., if only bit 29 is 1 and both bits 27 and 28 are 0, the OR gate 1605 outputs 0.

The three bits from bit 27 to bit 29 of the output from the shift register 1205' are also input to the OR gate 1606, but with only bit 28 inverted before being input. If all three input bits are zero, i.e., if only bit 28 is 1 and both bits 27 and 29 are 0, the OR gate 1606 outputs 0.

The three bits from bit 27 to bit 29 of the output from the shift register 1205' are also input to the OR gate 1607, but with only bit 27 inverted before being input. If all three input bits are 0, i.e., if only bit 27 is 1 and both bits 28 and 29 are 0, the OR gate 1607 outputs 0.

The outputs from the three OR gates 1605, 1606, and 1607 are input to the NAND gate 1608, which outputs 1 when any one of the inputs thereto is 0.

The NOR gate 1603 thus outputs 1 only when the code sequence 1000000000000xxx001 appears from bit 14 to bit 32 in the output from the shift register 1205'. Note that the three bits from bit 27 to bit 29, indicated by axis in the preceding code sequence, are not input to the NOR gate 1603, and may therefore be either 0 or 1. Note that the twelve consecutive zeroes in the code sequence detected by the NOR gate 1603 are only one bit longer than the maximum eleven consecutive zeroes in the code sequence after 8–16 modulation, and should not appear in any data other than the synchronization code. However, when noise or other factors cause a temporary shift in the inversion position of the NRZI signal as described above, a code sequence with twelve consecutive zeroes may occur in the non-synchronization code data. To accurately separate the synchronization code from the other data, it is therefore necessary to also detect the inversion position between the main sequence and the addendum of the synchronization code.

To accomplish this, the NAND gate 1608 outputs 1 only when one of bits 27, 28, and 29 in the output from the shift register 1205' is 1. One of bits 27, 28, and 29 in the output from the shift register 1205' will be 1 when the inversion position of the NRZI signal, i.e., the normal position of the 1 in the NRZI signal code sequence, is shifted one bit due to noise or other factor as described above. When this occurs, the signal length of the synchronization code identifier does not change, but the position of the synchronization code identifier in the code sequence shifts one bit higher or lower as described with reference to FIG. 19.

Therefore, the output of the AND gate 1604, i.e., the 1 output as the synchronization code detection signal, indicates that the 32-bit output from the shift register 1205' is the synchronization code while allowing the position of the synchronization code identifier to shift one bit higher or lower in the code sequence.

When the output from the NOR gate 1603 is 1 and the output of the OR gate 1606 is 0, the 32-bit output from the shift register 1205' precisely matches the 32-bit synchronization code. An AND gate (not shown in the figures) therefore obtains the logical product (AND) of the output of the NOR gate 1603 and the inverted output of the OR gate 1606 to output the set signal to the $1/16^{th}$ frequency divider 1207'. Note that the $1/16^{th}$ frequency divider 1207' also adjusts the phase of the word clock to rise (or fall), the word clock rise (or fall) being used as the latch enable signal, at the timing of the set signal. The phase of the frame clock described below is also adjusted based on the set signal.

When the threshold value used for wave-shaping the NRZI signal from the analog reproduction signal fluctuates, the signal length TS of the synchronization code identifier remains precisely 18T. The present embodiment therefore uses this fact to adjust the drive speed of the recording medium based on the signal length TS of the synchronization code identifier.

When the optical disk reproduction apparatus starts up, the read clock frequency and the rotational speed of the optical disk are often not accurately synchronized. When this occurs, the NRZ signal obtained by wave shaping the analog reproduction signal will not necessary express the recorded code sequence. A structure for counting the read clock of a code sequence corresponding to the synchronization code identifier from the NRZ signal not necessary expressing the recorded code sequence is therefore described below with reference to FIG. 17A. Because the optical disk speed is adjusted based on a synchronization code signal length TS of $2T_{max}$ in a conventional optical disk reproduction apparatus in which the synchronization code signal length TS=$2T_{max}$, the major components alone are described briefly below.

Figure 17A:
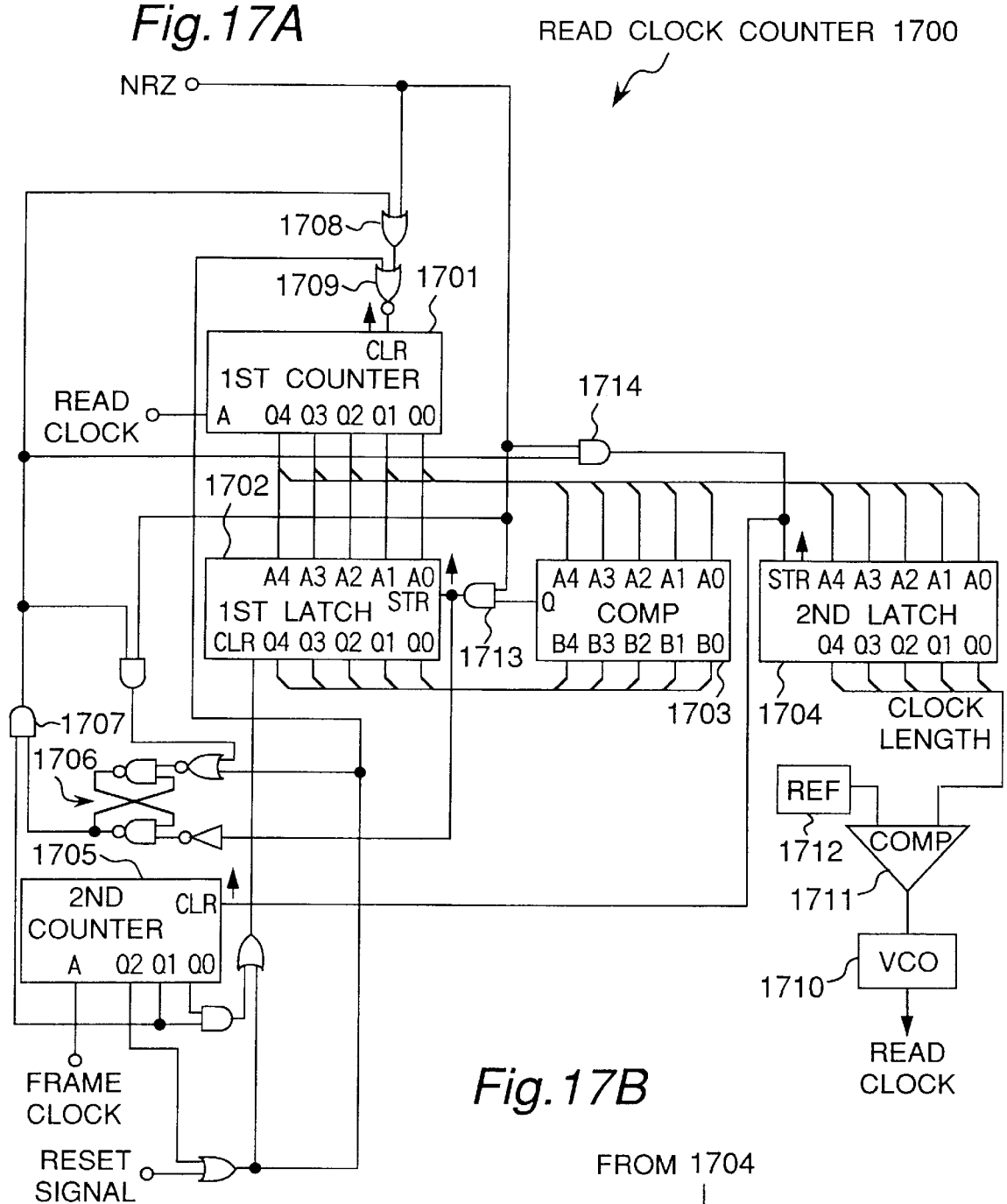
FIG. 17A is a block diagram of a read clock counter for counting the read clock corresponding to a synchronization code identifier with a signal length TS=18T.

FIG. 17A is a block diagram of a read clock counter 1700 for counting the read clock corresponding to a synchronization code identifier with a signal length TS=18T.

The read clock counter 1700 comprises a first counter 1701, a first latch 1702, a comparator 1703, a second latch 1704, and a second counter 1705.

The first counter 1701 counts the read clock CLK, and clears the count at the drop (trailing edge) of the NRZ signal 1.

When the comparator 1703 outputs 1 and the NRZ signal is 1, the first latch 1702 latches the count of the first counter 1701 at the rise (leading edge) of the NRZ signal. Thus, the first counter 1701 latches the peak value of the read clock CLK counted between the first 1 and the second 1 of the NRZ signal.

The comparator 1703 compares the count supplied from the first counter 1701 and the count stored by the first latch 1702, and outputs 1 if the count of the first counter 1701 is equal to or greater than the count stored by the first latch 1702.

The second latch 1704 latches the count of the first counter 1701, which indicates the number of the read clock CLK corresponding to the length of the synchronization code identifier.

The second counter 1705 counts the frame clock, which has the same period as the nominal period at which the synchronization code appears in the code sequence.

When the second counter 1705 counts two frame clocks, counter 1705 produces a HIGH level from its terminal Q1. By this moment, the first latch 1702 has already stored the maximum inversion interval $T_{max}$.

Then, when the main sequence of the identifier in the NRZ signal comes, the first counter 1701 will count up to a value greater than $T_{max}$ that has been held in the first latch 1702. When the counted value of the first counter 1701 exceeds the value $T_{max}$ stored in the first latch 1702, the comparator 1703 produces a HIGH level from its Q output. Thereafter, in response to the leading edge (rise) of the next NRZ signal 1 located between the main sequence and the addendum, AND circuit 1713 produces a HIGH level so as to flip a flip-flop circuit 1706 which then produces a HIGH level. Thus, in turn, AND circuit 1707 produces a HIGH level. This HIGH level is used as a clear prohibit signal. The HIGH level clear prohibit signal is applied to one input of OR circuit 1708 so that even when the OR circuit 1708 receives the trailing edge (drop) of said NRZ signal 1, the output of the OR circuit 1708 is maintained as a HIGH level. Thus, the first counter 1701 will be prohibited from clearing the count. Thus, the first counter 1701 will not be cleared even if the addendum comes, but continues to count up, cumulating over the value counted during the main sequence. Then, at the end of the addendum where the leading edge (rise) of the next NRZ signal 1 comes, AND circuit 1714 produces a HIGH level so that counted value of the first counter 1701, that is the count effected continuously during the main sequence and the addendum is latched in the second latch 1704. Also, by the leading edge (rise) of this NRZ signal 1, the flip-flop 1706 is flipped again to produce a LOW level, thus terminating the clear prohibit signal. Then, by the trailing edge (drop) of the NRZ signal 1, the first counter 1701 is cleared.

When the rotational speed of the optical disk is slower than the speed required to synchronize with the read clock, the number of consecutive zeroes in the NRZ signal obtained from the analog reproduction signal increases. In the period of the data cum synchronization code containing the synchronization code, the number of consecutive zeroes in the NRZ signal reaches the greatest number in the main sequence of the synchronization code identifier. The read clock CLK is therefore counted until the drop of the next 1 in the NRZ signal immediately after the maximum number of consecutive zeroes in the NRZ signal is counted as the read clock CLK count.

This count identifies the number of the read clock CLK corresponding to the signal length TS=18T of the synchronization code identifier, and is a value greater than 18 when the rotational speed of the optical disk is slower than the rotational speed at which synchronization to the read clock CLK is possible. Conversely, when the rotational speed of the optical disk is faster than the rotational speed at which synchronization to the read clock CLK is possible, this count is a value less than 18. Because the signal length TS of the synchronization code identifier is 18T even when the threshold value for wave shaping fluctuates, the rotational speed of the optical disk is known to be slower than the rotational speed at which synchronization to the read clock CLK is possible when the output from the second latch 1704 is a value greater than 18. Likewise, the rotational speed of the optical disk is known to be faster than the rotational speed at which synchronization to the read clock CLK is possible when the output from the second latch 1704 is a value less than 18.

As shown in FIG. 17A, the count stored by the second latch 1704 is output to, for example, a comparator 1711 which compares the count from the latch 1704 with a predetermined reference from a reference circuit 1712. The compared result is applied to a voltage control oscillator 1710. The voltage control oscillator adjusts the frequency of the read clock CLK so that the count of the read clock CLK input from the second latch 1704 is synchronized to TS=18T.

Figure 17B:
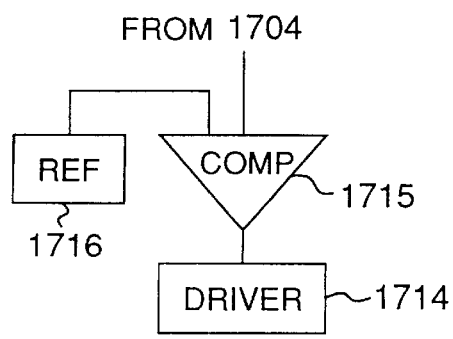
FIG. 17B is a block diagram showing a portion of that shown in FIG. 17A.

Alternatively, as shown in FIG. 17B, the count stored by the second latch 1704 is output to, for example, a comparator 1715 which comparing the count from latch 1704 with a predetermined reference from a reference circuit 1716. The compared result is applied to a turntable drive controller 1714. The turntable drive controller 1714 adjusts the rotational speed of the turntable (i.e., the drive speed of the recording medium) so that the count of the read clock CLK input from the second latch 1704 is synchronized to TS=18T.

In this read clock counter 1700, the count of the second counter 1705 is cleared at the timing at which the second latch 1704 latches the count of the first counter 1701. If the count of the second counter 1705 reaches 4 when the second latch 1704 does not latch said count, the count of the second counter 1705 is forcibly cleared. As a result, the turntable speed can be adjusted based on the count of the read clock CLK counted between the next two frame clocks even when the first latch 1702 latches an abnormally high value due, for example, to a 1 being dropped in the NRZ signal. This means that the turntable speed adjusted according to a wrong count can be readjusted to the correct speed.

By thus setting the signal length TS of the synchronization code identifier to TS=14T (main sequence)+4T (addendum), the present embodiment of the invention can express the synchronization code with a signal length shorter than that of the conventional synchronization code, wherein the signal length TS=$2T_{max}$ (=2×11T). By further using a main sequence signal length of 14T (=$T_{max}$+3T), the reproduction apparatus can more reliably distinguish the synchronization code from the non-synchronization code data. The reproduction apparatus is therefore able to adjust the word clock phase based on the identified synchronization code, and can accurately and reliably read the code words even when bits are lost in the code sequence due, for example, to signal dropout. As a result, the reproduction apparatus can read the data recorded to the recording medium with good precision.

Furthermore, by adding an addendum of signal length 4T (=$T_{min}$+1T) to the main sequence of the synchronization code, the signal length TS of the complete synchronization code identifier will remain a precise 18T even when the wave shaping threshold value fluctuates due to noise or other factor. As a result, the reproduction apparatus for reproducing data cum synchronization code according to the present embodiment of the invention can precisely adjust the drive speed of the recording medium (or the frequency of the read clock) during startup of the reproduction apparatus based on the signal length TS=18T of the complete synchronization code identifier to match the read clock frequency (or the drive speed of the recording medium).

The present invention had the following advantageous effects.

By means of the present invention, a code segment corresponding to the particular code sequence expressing the synchronization code appears at a regular interval in the area to which information containing said synchronization code is recorded to the recording medium. This particular code sequence is generated to contain a bit string of the one binary value for which the maximum number of consecutive bits is limited in a string length at least two bits longer than that maximum limit, and does not appear in the information other than the synchronization code ("non-synchronization code information" or "data code") within the error correction range in which reading errors can be corrected.

It is therefore possible for the reproduction apparatus to accurately discriminate the synchronization code from the other code sequences while reproducing the non-synchronization code information (data code) from the recording medium. Moreover, the reproduction apparatus can accurately read divisions between code sequences other than the synchronization code, and particular information immediately following the synchronization code, based on the synchronization code thus reliably identified. The length of the code sequence identifying the synchronization code can also be set shorter than the conventional synchronization code, which is repeated twice separated by one bit of the binary value opposite that for which the maximum consecutive bit count is limited. As a result, the data capacity thus freed by this shorter code sequence can be used to record an equivalent amount of information other than the synchronization code identifier to the recording medium, thus increasing the recording density of the recording medium. The recording medium to which the synchronization code according to the embodiment of the invention is recorded can therefore provide information that includes the synchronization code and can be used to reproduce the non-synchronization code information with good precision to the reproduction apparatus used to reproduce said information from the recording medium.

In the recording medium according to the embodiment of the invention, a recording state continuing for two bits longer than the longest recording state that may occur in the information not containing the synchronization code appears at a regular interval in the area to which is recorded the information containing the synchronization code. By means of the synchronization code thus recorded, the effects described above can be achieved by means of the recording medium according to the present invention.

In the recording medium according to the embodiment, the non-synchronization code information is expressed by code sequences for which maximum and minimum limits are defined for the number of consecutive bits of one binary value that may appear therein, and the synchronization code contains a particular code sequence identifying the code sequence as part of the synchronization code. This particular code sequence comprises a first consecutive sequence and a second consecutive sequence having a combined length of a particular known value and separated by one bit of the other binary value, said first consecutive sequence being a bit string of the one binary code value for which a maximum consecutive bit limit is defined, and having a bit length at least two bits longer than the maximum consecutive bit limit, and said second consecutive sequence having a length within the maximum consecutive bit limit. As a result, the overall length of the particular code sequence identifying the synchronization code still remain constant while reading the binary code sequence from the recording medium even when noise or other factors cause threshold level shifting.

Therefore, in addition to the effects achieved by the invention, the reproduction apparatus for reproducing information from the recording medium can adjust the read clock frequency or the recording medium drive speed when reading the binary code sequences from the recording medium so that the length of the binary code sequences actually read from the recording medium match the predefined length of the particular code sequence based on the particular code sequence identifying the synchronization code. The recording medium can therefore adjust with good precision any synchronization shift in the read clock frequency and the recording medium drive speed.

In the recording medium, the second consecutive sequence of the recording medium is one bit longer than the defined minimum number of consecutive bits. The overall length of the particular code sequence can therefore be short, and the occurrence of read errors in the second consecutive sequence of the particular code sequence can be reduced, even when the threshold value fluctuates while reading the binary code sequence containing the synchronization code from the analog signal reproduced from the recording medium.

In the recording medium, one recording state continuing for a period two or more bits longer than the longest recording state of the same signal level appearing in the code segment corresponding to the information not containing the synchronization code, and another recording state continuing for a period one or more bits longer than the shortest recording state of the above signal level appearing in the code segment corresponding to the information not containing the synchronization code, appear consecutively at a constant interval in the area of the recording medium to which information containing the synchronization code is recorded.

In the data transmission method, the non-synchronization code information is converted to code sequences in which the maximum number of consecutive bits of one binary code value is limited, synchronization codes containing a particular code sequence of said one binary value in a bit string at least two bits longer than said maximum number are inserted at a constant interval to the non-synchronization code information, and the resulting bit sequence is transmitted in a time-series sequence. As a result, when the transmitted code sequence is obtained as an analog signal containing said code sequence as information, and the code sequence is obtained from said analog signal, a code sequence containing the one limited binary code value in a string two bits longer than said maximum limit will not appear in the non-synchronization code information insofar as any read errors occurring in the read code sequence are within the error correction capability of the reproduction apparatus.

As a result, a reproduction apparatus for reproducing the non-synchronization code information from the code sequence containing the synchronization code transmitted as a time-series sequence can reliably discriminate the synchronization code sequences from the non-synchronization code sequences, and based on the identified synchronization code can reliably discriminate divisions in the non-synchronization code sequences and the location of particular information in the code sequence. Furthermore, because the overall length of the particular code sequence identifying the synchronization code can be shorter than the conventional synchronization code, which is repeated twice separated by one bit of the binary value opposite that for which the maximum consecutive bit count is limited. As a result, the transmission efficiency of code sequences expressing information other than the synchronization code identifier can be improved by an amount equivalent to the shorter code sequence.

In the data transmission method, the non-synchronization code information is converted to code sequences for which maximum and minimum limits are defined for the number of consecutive bits of one binary value that may appear therein, a synchronization code containing a particular code sequence identifying the code sequence as part of the synchronization code is then inserted to the non-synchronization code information at a regular interval, and the resulting bit sequence is transmitted in a time-series sequence. The particular code sequence contained in the synchronization code comprises a first consecutive sequence and a second consecutive sequence having a combined length of a particular known value and separated by one bit of the other binary value, said first consecutive sequence being a bit string of the one binary code value for which a maximum consecutive bit limit is defined, and having a bit length at least two bits longer than the maximum consecutive bit limit, and said second consecutive sequence having a length within the maximum consecutive bit limit.

As a result, the overall length of the particular code sequence contained in the synchronization code thus transmitted will remain constant even when the threshold value fluctuates when the code sequence transmitted to the reproduction apparatus is read as an analog signal containing the code sequence as information, and the analog signal is converted to a digital code sequence. Therefore, the data transmission method is able to correct any synchronization shift between the data transmission speed and the read clock period referenced to the overall length of the particular code sequence when the code sequence is read from the analog signal.

In a data reproduction method, non-synchronization code information is converted to code sequences in which the maximum number of consecutive bits of one binary value is limited, a synchronization code containing a particular code sequence of said one binary value in a bit string that is two or more bits longer than said maximum number of consecutive bits is inserted to the non-synchronization code information at a regular interval, and the resulting bit sequence is received as transmitted time-series information. As a result, when the transmitted code sequence is obtained as an analog signal containing said code sequence as information, and the code sequence is obtained from said analog signal, said particular code sequence will not appear in the non-synchronization code information insofar as any read errors occurring in the read code sequence are within the error correction capability of the reproduction apparatus.

As a result, the data reproduction method can reliably discriminate the synchronization code information from the non-synchronization code information in the information containing the synchronization code transmitted as a time-series sequence. It is also possible referenced to the position of the identified particular code sequence to reliably reproduce the type information contained in the synchronization code, the beginning separator for the code word transmitted immediately following the synchronization code, and the address expressed by the code word sequence of which the first word is the code word transmitted immediately following the synchronization code.

By the data reproduction method, the overall length of the particular code sequence contained in the synchronization code thus transmitted will remain constant even when the threshold value fluctuates when the code sequence transmitted to the reproduction apparatus is read as an analog signal containing the code sequence as information, and the analog signal is converted to a digital code sequence. It is therefore also possible referenced to the position of the identified particular code sequence to reliably reproduce the type information contained in the synchronization code, the beginning separator for the code word transmitted immediately following the synchronization code, and the address expressed by the code word sequence of which the first word is the code word transmitted immediately following the synchronization code.

By the data reproduction method, the overall length of the particular code sequence contained in the synchronization code thus transmitted will remain constant even when the threshold value fluctuates when the code sequence transmitted to the reproduction apparatus is read as an analog signal containing the code sequence as information, and the analog signal is converted to a digital code sequence. The frequency control step of the data reproduction method uses this constant particular code sequence length to control the frequency of the read clock so that in the time-series binary code sequence read synchronized to the read clock, the total number of bits of one code value in the maximum length consecutive bit sequence and the bit sequence on one known side of said maximum length consecutive bit sequence matches a predetermined value based on the overall length of the particular code sequence in the synchronization code. Note that this one code value is the code value for which maximum and minimum limits are defined for the number of consecutive bits that can appear in the non-synchronization code information.

By thus controlling the read clock frequency, the data reproduction method is able to correct any synchronization shift between the data transmission speed and the read clock frequency. It is therefore possible to even more reliably reproduce the type information contained in the synchronization code, the beginning separator for the code word transmitted immediately following the synchronization code, and the address expressed by the code word sequence of which the first word is the code word transmitted immediately following the synchronization code.

In the data reproduction method, the overall length of the particular code sequence contained in the synchronization code thus transmitted will remain constant even when the threshold value fluctuates when the code sequence transmitted to the reproduction apparatus is read as an analog signal containing the code sequence as information, and the analog signal is converted to a digital code sequence. Therefore, the drive speed control step of the data reproduction method uses this constant particular code sequence length to control the drive speed of the recording medium so that in the time-series binary code sequence read synchronized to the read clock, the total number of bits of one code value in the maximum length consecutive bit sequence and the bit sequence on one known side of said maximum length consecutive bit sequence matches a predetermined value based on the overall length of the particular code sequence in the synchronization code. Note that this one code value is the code value for which maximum and minimum limits are defined for the number of consecutive bits that can appear in the non-synchronization code information.

By thus controlling the recording medium drive speed, the data reproduction method is able to correct any synchronization shift between the recording medium drive speed, i.e., the transmission rate of the time-series information, and the read clock frequency. It is therefore possible to even more reliably reproduce the type information contained in the synchronization code, the beginning separator for the code word transmitted immediately following the synchronization code, and the address expressed by the code word sequence of which the first word is the code word transmitted immediately following the synchronization code.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An article of manufacture comprising:
   a reproducer usable recording medium having a reproducer readable code embodied therein, said reproducer readable code in said article of manufacture comprising; synchronization codes provided along a track with an interval between two synchronization codes; and data codes filled in said interval between two synchronization codes;
   said data code being formed by a plurality of ON markings representing a first level of a binary code and OFF markings representing a second level of a binary code, a maximum length of a continuous marking in said data codes being limited to $T_{max}$, and a minimum length of a continuous marking in said data codes being limited to $T_{min}$,
   said synchronization code being formed by a plurality of ON markings representing a first level of a binary code and OFF markings representing a second level of a binary code, a first type binary symbol being one of the first level or second level and a second type binary symbol being the other of the first level or second level:
   said synchronization code comprising an identifier having a plurality of first type binary symbols inserted between two second type binary symbols, the number of the first type binary symbols being $T_{max}$+nT in which n is an integer equal to or greater than 1 and T is a unit length representing one binary code, a type of the first type binary symbol being dependent on a state of the data code immediately preceding the synchronization code.

2. An article of manufacture according to claim 1, wherein said $T_{max}$ is 14T.

3. An article of manufacture according to claim 1, wherein said $T_{max}$ is 13T.

4. An article of manufacture according to claim 1, wherein said n is 2.

5. An article of manufacture according to claim 1, wherein said n is 3.

6. An article of manufacture according to claim 1, wherein said synchronization codes and data codes are formed by an NRZI processing.

7. An article of manufacture according to claim 1, wherein said $T_{min}$ is 3T.

8. An article of manufacture according to claim 1, wherein said identifier comprises a main sequence and an addendum following said main sequence, said main sequence having a continuous marking of the first level with a bit length $T_{max}$+nT and said addendum having a continuous marking of the second level with a bit length $T_{min}$+mT, in which m is an integer equal to or greater than 0.

9. An article of manufacture according to claim 8, wherein said $T_{max}$+nT is 14T.

10. An article of manufacture according to claim 8, wherein said $T_{min}$+mT is 4T.

11. An article of manufacture according to claim 1, wherein said data codes are formed by a sequence of code words obtained by 8–15 conversion, said 8–15 conversion converting every 8-bit digital data word to a 15-bit code word.

12. An article of manufacture according to claim 1, wherein said data codes are formed by a sequence of code words obtained by 8–16 conversion, said 8–16 conversion converting every 8-bit digital data word to a 16-bit code word.

13. An article of manufacture according to claim 1, wherein said ON marking is a pit formed in a surface of said recording medium.

14. An article of manufacture according to claim 1, wherein said ON marking is a physical change added to a surface of said recording medium.

15. A data transmission method for transmitting an original data comprising:
   (a) converting said original data to sequential data codes, said data code being formed by a combination of first level binary codes and second level binary codes, a maximum length of a continuous binary codes of one level in said data codes being limited to $T_{max}$, and a minimm length of a continuous binary codes of one level in said data codes being limited to $T_{min}$, a first type binary symbol being one of the first level or second level and a second type binary symbol being the other of the first level or second level;
   (b) generating a synchronization code, said synchronization code being formed by a combination of first level binary codes and second level binary codes, said synchronization code comprising an identifier having a plurality of first type binary symbols inserted between two second type binary symbols, the number of the first type binary symbols being $T_{max}$+nT in which n is an integer equal to or greater than 1 and T is a unit length representing one binary code, a type of the first type binary symbol being dependent on a state of the data code immediately preceding the synchronization code; and
   (c) inserting said synchronization code intermittently in said sequential data codes.

16. A data transmission method according to claim 15, wherein said $T_{max}$ is 14T.

17. A data transmission method according to claim 15, wherein said $T_{max}$ is 13T.

18. A data transmission method according to claim 15, wherein said n is 2.

19. A data transmission method according to claim 15, wherein said n is 3.

20. A data transmission method according to claim 15, wherein said synchronization codes and data codes are formed by an NRZI processing.

21. A data transmission method according to claim 15, wherein said $T_{min}$ is 3T.

22. A data transmission method according to claim 15, wherein said identifier comprises a main sequence and an addendum following said main sequence, said main sequence having a continuous marking of the first level with a bit length $T_{max}$+nT and said addendum having a continuous marking of the second level with a bit length $T_{min}$+mT, in which m is an integer equal to or greater than 0.

23. An article of manufacture according to claim 22, wherein said $T_{max}$+nT is 14T.

24. An article of manufacture according to claim 22, wherein said $T_{min}$+mT is 4T.

25. A data transmission method according to claim 15, wherein said data codes are formed by a sequence of code words obtained by 8–15 conversion, said 8–15 conversion converting every 8-bit digital data word to a 15-bit code word.

26. A data transmission method according to claim 15, wherein said data codes are formed by a sequence of code words obtained by 8–16 conversion, said 8–16 conversion converting every 8-bit digital data word to a 16-bit code word.

27. A data transmission apparatus for transmitting an original data comprising:
   converting means for converting said original data to sequential data codes, said data code being formed by a combination of first level binary codes and second level binary codes, a maximum length of a continuous binary codes of one level in said data codes being limited to $T_{max}$, and a minimum length of a continuous binary codes of one level in said data codes being limited to $T_{min}$, a first type binary symbol being one of the first level or second level and a second type binary symbol being the other of the first level or second level;
   generating means for generating a synchronization code, said synchronization code being formed by a combination of first level binary codes and second level binary codes, said synchronization bode comprising an identifier having a plurality of first type binary symbols inserted between two second type binary symbols, the number of the first type binary symbols being $T_{max}$+nT in which n is an integer equal to or greater than 1 and T is a unit length representing one binary code, the first the binary symbol being dependent on a state of the data code data preceding the synchronization code; and
   inserting means for inserting said synchronization code intermittently in said sequential data codes.

28. A data transmission apparatus according to claim 27, wherein said $T_{max}$ is 14T.

29. A data transmission apparatus according to claim 27, wherein said $T_{max}$ is 13T.

30. A data transmission apparatus according to claim 27, wherein said n is 2.

31. A data transmission apparatus according to claim 27, wherein said n is 3.

32. A data transmission apparatus according to claim 27, wherein said synchronization codes and data codes are formed by an NRZI processing.

33. A data transmission apparatus according to claim 27, wherein said $T_{min}$ is 3T.

34. A data transmission apparatus according to claim 27, wherein said identifier comprises a main sequence and an addendum following said main sequence, said main sequence having a continuous marking of the first level with a bit length $T_{max}$+nT and said addendum having a continuous marking of the second level with a bit length $T_{min}$+mT, in which m is an integer equal to or greater than 0.

35. An article of manufacture according to claim 34, wherein said $T_{max}$+nT is 14T.

36. An article of manufacture according to claim 34, wherein said $T_{min}$+mT is 4T.

37. A data transmission apparatus according to claim 27, wherein said data codes are formed by a sequence of code words obtained by 8–15 conversion, said 8–15 conversion converting every 8-bit digital data word to a 15-bit code word.

38. A data transmission apparatus according to claim 27, wherein said data codes are formed by a sequence of code words obtained by 8–16 conversion, said 8–16 conversion converting every 8-bit digital data word to a 16-bit code word.

39. A data reproduction method for reproducing an original data from sequential data codes intermittently inserted between synchronization codes, said sequential data codes and synchronization codes being stored in a recording medium,
   said data code being formed by a combination of first level binary codes and second level binary codes, a maximum length of continuous binary codes of one level in said data codes being limited to $T_{max}$, and a minimum length of continuous binary codes of one level in said data codes being limited to $T_{min}$, a first type binary symbol being of the first level or second level and a second type binary symbol being the other of the first level or second level;
   said synchronization code being formed by a combination of first level binary codes and second level binary codes, said synchronization code comprising an identifier having a plurality of first type binary symbols inserted between two second type binary symbols, the number of the first type binary symbols being $T_{max}$+nT in which n is an integer equal to or greater than 1 and T is a unit length representing one binary code, a type of the first type binary symbol being dependent on a state of the data code immediately preceding the synchronization code;
   said method comprising:
      (a) detecting said identifier by detecting said continuous binary codes of one level;
      (b) separating said synchronization code from said data code; and
      (c) re-converting said data code to original data.

40. A data reproduction method according to claim 39, further comprising the step of:
   (d) reading information of the extracted synchronization code to detect the location of said data code following the extracted synchronization code.

41. A data reproduction method according to claim 39, wherein said identifier comprises a main sequence and an addendum following said main sequence, said main sequence having a continuous marking of the first level with a bit length $T_{max}$+nT and said addendum having a continuous marking of the second level with a bit length $T_{min}$+mT, in which m is an integer equal to or greater than 0.

42. A data reproduction method according to claim 41, wherein said detecting step (a) comprising the steps of:
   (a1) generating read clocks at a bit rate of the binary code;
   (a2) counting said read clocks during the continuous binary codes of one level and the next continuous binary codes of the other level; and
   (a3) detecting said identifier when the counted amount become equal to $(T_{max}+nT)+(T_{min}+mT)$.

43. A data reproduction method according to claim 42, further comprising the step of:
   (e) controlling the frequency of said read clocks by comparing said counted amount with a predetermined amount and applying a difference therebetween to a voltage control oscillator.

44. A data reproduction method according to claim 42, further comprising the step of:

(e) controlling a rotational velocity of a recording medium by comparing said counted amount with a predetermined amount and applying a difference therebetween to a driver for driving the recording medium.

45. A data reproduction apparatus for reproducing an original data from sequential data codes intermittently inserted with a synchronization code, said sequential data codes and synchronization codes being stored in a recording medium, said data code being formed by a combination of first level binary codes and second level binary codes, a maximum length of a continuous binary codes of one level in said data codes being limited to $T_{max}$, and a minimum length of a continuous binary codes of one level in said data codes being limited to $T_{min}$, a first type binary symbol being one of the first level or second level and a second type binary symbol being the other of the first level or second level;

said synchronization code being formed by a combination of first level binary codes and second level bit codes, said synchronization code comprising an identifier having a plurality of first type binary symbols inserted between two second type binary symbols, the number of the first type binary symbols being $T_{max}+nT$ in which n is an integer equal to or greater than 1 and T is a unit length representing one binary code, a type of the first type binary symbol being dependent on a state of the data code immediately preceding the synchronization code;

said apparatus comprising:

detecting means for detecting said identifier by detecting said continuous binary codes of one level;

separating means for separating said synchronization code from said data code; and re-converting means for re-converting said data code to original data.

46. A data reproduction apparatus according to claim 45, further comprising:

(d) reading means for reading information of the synchronization code to detect the location of said data code following the detected synchronization code.

47. A data reproduction apparatus according to claim 45, wherein said identifier comprises a main sequence and an addendum following said main sequence, said main sequence having a continuous marking of the first level with a bit length $T_{max}+nT$ and said addendum having a continuous marking of the second level with a bit length $T_{min}+mT$, in which m is an integer equal to or greater than 0.

48. A data reproduction apparatus according to claim 47, wherein said detecting means comprising:

generating means for generating read clocks at a bit rate of the binary code;

counting means for counting said read clocks during the continuous binary codes of one level and the next continuous binary codes of the other level; and detecting means for detecting said identifier when the counted amount become equal to $(T_{max}+nT)+(T_{min}+mT)$.

49. A data reproduction apparatus according to claim 48, wherein said generating means comprises:

a comparator for comparing said counted amount with a predetermined amount to produce a difference therebetween; and a voltage control oscillator for controlling the frequency of said read clocks by said difference.

50. A data reproduction apparatus according to claim 48, wherein said generating means comprises:

a drive controller for controlling the rotational velocity of a recording medium by comparing said counted amount with a predetermined amount and driving the recording medium at a predetermined speed.

* * * * *

UNITED STATES PATENT AND TRADEMARK OFFICE
CERTIFICATE OF CORRECTION

PATENT NO. : 5,912,869
DATED : June 15, 1999
INVENTOR(S) : S. TANAKA et al.

It is certified that error appears in the above-identified patent and that said Letters Patent is hereby corrected as shown below:

On the title page, item [56], References Cited, Other Publications, lines 7-8, change "disk Cartiridge" to --Disk Cartridge--.

At column 41, line 30 (claim 1, line 5) of the printed patent, after "comprising" change ";" to -- : --.

At column 43, lines 41-42 (claim 27, lines 21-22) of the printed patent, "the first the binary" should be --a type of the first type binary--.

At column 43, line 43 (claim 27, line 23) of the printed patent, "data" (second occurrence) should be --immediately--.

At column 44, line 23 (claim 39, line 12) of the printed patent, after "being" insert --one--.

At column 45, line 24 (claim 45, line 16) of the printed patent, "bit" should be --binary--.

At column 43, line 36 (claim 27, line 16) of the printed patent, "bode" should be --code--.

Signed and Sealed this

Tenth Day of October, 2000

Attest:

Q. TODD DICKINSON

*Attesting Officer*    *Director of Patents and Trademarks*

UNITED STATES PATENT AND TRADEMARK OFFICE
CERTIFICATE OF CORRECTION

PATENT NO. : 5,912,869
DATED : June 15, 1999
INVENTOR(S) : S. Tanaka et al.

Page 1 of 1

It is certified that error appears in the above-identified patent and that said Letters Patent is hereby corrected as shown below:

Column 43,
Line 8, "An article of manufacture" should be -- A data transmission method --.
Line 10, "An article of manufacture" should be -- A data transmission method --.
Line 66, "An article of manufacture" should be -- A data transmission method --; and "method" should be -- apparatus --.

Column 44,
Line 1, "An article of manufacture" should be -- A data transmission method --; and "method" should be -- apparatus --.

Signed and Sealed this

Sixteenth Day of April, 2002

Attest:

Attesting Officer

JAMES E. ROGAN
Director of the United States Patent and Trademark Office